United States Patent [19]

Kaga et al.

[11] Patent Number: 5,200,635

[45] Date of Patent: Apr. 6, 1993

[54] SEMICONDUCTOR DEVICE HAVING A LOW-RESISTIVITY PLANAR WIRING STRUCTURE

[75] Inventors: Toru Kaga, Urawa; Shinichiro Kimura, Kunitachi; Katsutaka Kimura, Akishima; Yoshinobu Nakagome, Hachiouji; Digh Hisamoto, Kokubunji; Yoshifumi Kawamoto, Tsukui; Eiji Takeda, Koganei; Shimpei Iijima, Akishima; Tokuo Kure, Nishitama; Takashi Nishida, Taitou, all of Japan

[73] Assignee: Hitachi, Ltd., Tokyo, Japan

[21] Appl. No.: 686,757

[22] Filed: Apr. 17, 1991

Related U.S. Application Data

[63] Continuation-in-part of Ser. No. 475,148, Feb. 5, 1990, Pat. No. 5,140,389, which is a continuation-in-part of Ser. No. 287,881, Dec. 21, 1988, Pat. No. 4,970,564.

[30] Foreign Application Priority Data

| Apr. 17, 1990 [JP] | Japan | 2-099439 |
| May 9, 1990 [JP] | Japan | 2-117573 |
| May 14, 1990 [JP] | Japan | 2-121117 |

[51] Int. Cl.$^5$ ............ H01L 29/68; H01L 23/48; H01L 29/04
[52] U.S. Cl. ............ 257/306; 257/308; 257/384
[58] Field of Search ............ 357/23.6, 71, 59 K, 357/59 I, 71 S; 437/200

[56] References Cited

U.S. PATENT DOCUMENTS

| 4,674,176 | 6/1987 | Tuckerman | 357/71 |
| 4,974,055 | 11/1990 | Haskell | 357/71 |
| 4,994,893 | 2/1991 | Ozaki et al. | 357/23.6 |
| 5,012,309 | 4/1991 | Nakayama | 357/23.6 |
| 5,045,899 | 9/1991 | Arimoto | 357/23.6 |

OTHER PUBLICATIONS

*IEEE Transactions on Electron Devices*, vol. 38, No. 2, Feb. 1991, pp. 255-261.
1990 Symposium on VLSI Technology (IEEE), pp. 13-14.

*Primary Examiner*—Rolf Hille
*Assistant Examiner*—Robert Limanek
*Attorney, Agent, or Firm*—Antonelli, Terry, Stout & Kraus

[57] ABSTRACT

The present invention concerns a semiconductor device having a low-resistivity wiring structure. Wirings formed directly on a hill and valley structure result in a thin portion and, in an extreme case, a disconnected portion. This increases the resistivity of wirings on the hill and valley structure and lowers the reliability of the connection. In a case where the wirings are data lines of a memory, with an increased effective length, the resistance and the parasitic capacitance of the data line is greater. The above mentioned problems have been solved by wirings which comprise at least two layers of conductive film including a first conductive film as a lower layer and a second conductive film as an upper layer, and the first conductive layer has a surface moderating or planarizing the hills and valleys in the underlying material.

5 Claims, 24 Drawing Sheets

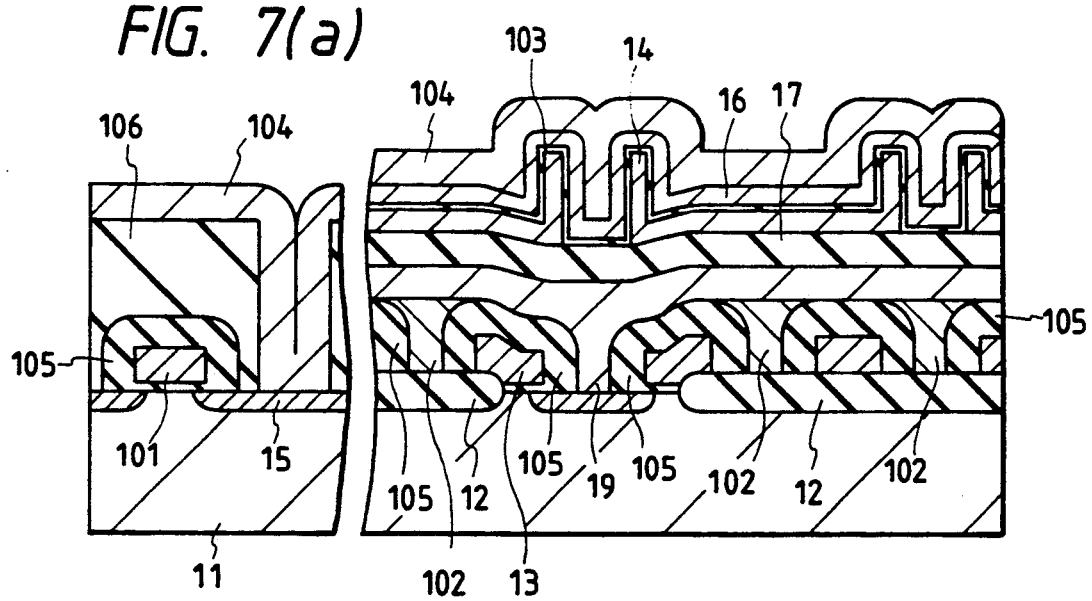
FIG. 7(a)
FIG. 7(b)
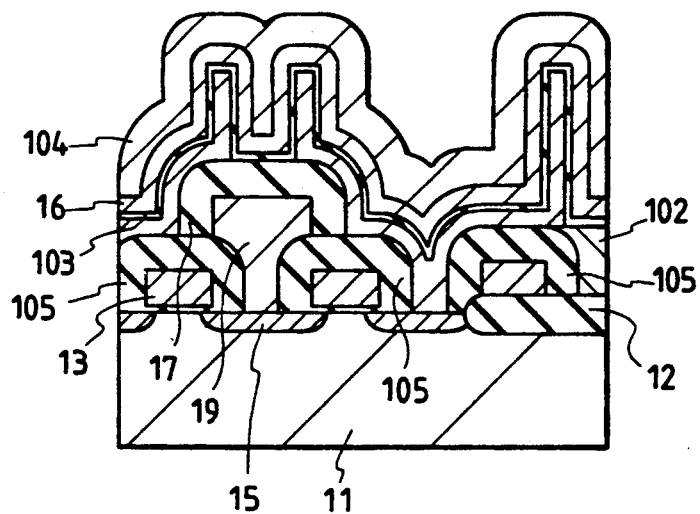
FIG. 7(c)

FIG. 13(c.)
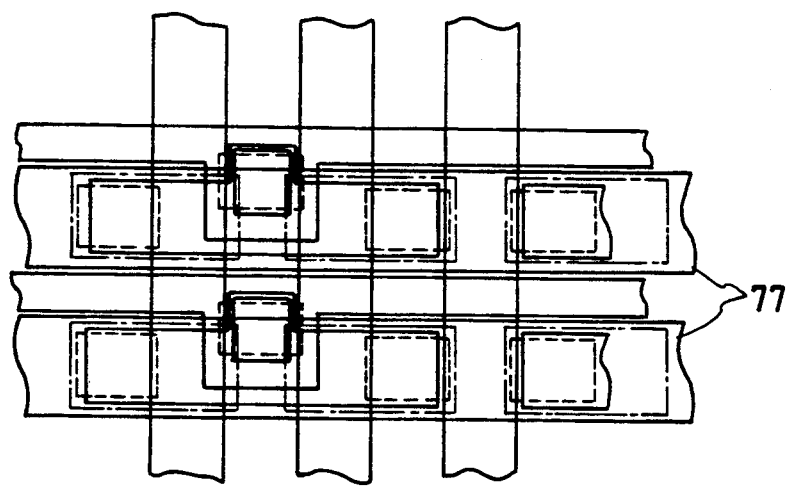
FIG. 13(d)
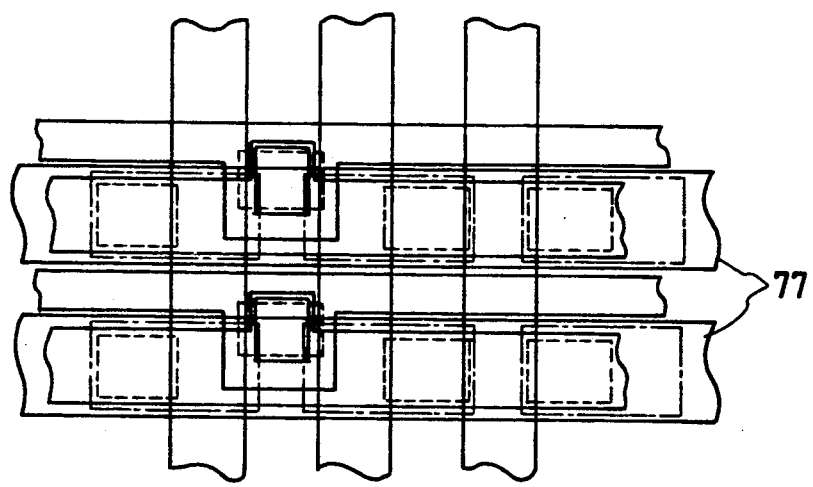

SEMICONDUCTOR DEVICE HAVING A LOW-RESISTIVITY PLANAR WIRING STRUCTURE

The present application is a continuation-in-part of copending application Ser. No. 475,148 filed Feb. 5, 1990 now U.S. Pat. No. 5,140,389 issued Aug. 18, 1992; which is a continuation-in-part of Ser. No. 287,881 filed Dec. 21, 1988, which issued to U.S. Pat. No. 4,970,564 on Nov. 13, 1990; each of which is incorporated by reference herein in its entirety.

BACKGROUND OF THE INVENTION

The present invention concerns a semiconductor device and fabrication method thereof and, more in particular, it relates to a semiconductor device having a low-resistivity wiring structure and a fabrication method thereof.

When wirings are formed on a hill and valley structure in existent semiconductor devices, an insulator has at first been deposited on the hill and valley structure to planarize the surface and wiring have been formed on the insulator as described in Japanese Patent Laying Open Hei 1-140644.

If wirings are formed directly on the hill and valley structure, it sometimes result in a portion lacking in a predetermined thickness and, in an extreme case, leads to disconnection, but wirings formed by the method described above can satisfy the required thickness and causes no disconnection.

SUMMARY OF THE INVENTION

In the prior art described above, however, the depth of contact holes formed in the insulator differs depending on the kind of the electrodes of elements, owing to the planarization with the insulator, which results in a problem in the deterioration of the fabrication accuracy for the contact holes and in view of the reliability of the conduction at the contact portions.

That is, owing to the planarization with the insulator, the depth of the contact holes for connection between the wirings and the electrodes below the insulator differs depending on the kind of the electrodes of the element. In particular, the depth of the contact hole to a semiconductor substrate is increased to bring about a problem of making it difficult to obtain a high reliability in the conduction of contact upon usual formation of a wiring layer such as by sputtering.

Further, there has been a problem, also in the fabrication of contact holes of different depth, that the etching rate to the insulator has to be increased extremely as compared with that for the material under the insulator.

The reliability for the connection of a deep contact hole may be increased by a method of selectively forming tungsten or the like to the contact hole. However, since wirings across the hill and valley portion with no contact hole can not be planarized only with such a means, the resistivity is increased.

Further, a combined use of the planarization with the insulator and the selective formation of tungsten to the contact holes results in a problem that planarization of wirings cannot be attained to all of the holes since the depth of the contact holes differs.

The present invention provides:

a semiconductor device comprising a semiconductor substrate, a semiconductor element disposed on the semiconductor substrate and wirings disposed on a structure having hills and valleys in an underlying material and connected with the semiconductor element, wherein the wirings comprise at least two layers of conductor films having a first conductor film as a lower layer and a second conductor film as an upper layer, in which the first conductor film has a surface moderating or planarizing the hills and valleys in the underlying material, a semiconductor device wherein the specific resistivity of the second conductor film is lower than the specific resistivity of the first conductor film, a semiconductor device, wherein the first conductor film contains at least one of polycrystalline silicon, W and TiN, a semiconductor device wherein the second conductor film contains at least one of polycrystalline silicon, W, Al, Cu, Mo, Ti, Ta, $WSi_2$, $MoSi_2$, $TiSi_2$, TiW and TiN, a semiconductor device comprising a semiconductor substrate, a capacitor disposed on the semiconductor substrate and a transistor disposed on the semiconductor substrate, the capacitor and the transistor constituting a memory cell in a dynamic random access memory, and further comprising data lines connected with a first electrode of the transistor, wherein the data line comprises at least two layers of conductor films having a first conductor film as a lower layer and a second conductor film as an upper layer, and the first conductor film has a surface moderating or planarizing hills and valleys in the underlying material, a semiconductor device wherein the specific resistivity of the second conductor film is lower than the specific resistivity of the first conductor film, a method of fabricating a semiconductor device, which comprises depositing a first conductor film on a hill and valley structure, etching the first conductor film to render the surface thereof as a surface moderating or planarizing hills and valleys and depositing a second conductor film on the first conductor film to form a wiring pattern, a method of fabricating a semiconductor device wherein the first conductor film contains a polycrystalline silicon and a step of selectively depositing the second conductor film to form a wiring pattern is included, and a method of manufacturing a semiconductor device wherein the second conductor film is a metal that can be silicided and a step of forming a wiring pattern by steps of siliciding a portion of the metal layer present on the first conductor film and removing an unreacted portion of the metal layer is included.

The first conductor film as the lower layer is formed for improving the reliability of contact connection and for planarizing and moderating the hills and valleys in the underlying material.

The second conductor film as the upper layer is formed for lowering the wiring resistivity.

The wiring material used for the first conductor film is preferably made of a material having a resistivity higher than that of the second conductor film as the upper layer but having a good step coverage in the contact hole or on the hill and valley structure.

The material having the good step coverage usable herein includes polycrystalline Si formed by a chemical vapor deposition (CVD) process and doping a dopant such as P or B by ion injection or heat or thermal diffusion into the polycrystalline Si, or polycrystalline SiO or amorphous Si applied with doping simultaneously with CVD.

W, TiN and the like may also be used.

For planarizing the surface of the first conductor film, isotropic or anisotropic dry etching may be used, use of isotropic etching being preferred, because a step on one side of the step portion can be made more moderate and the resistivity of the wirings thereon can be lowered.

As the conductive material for the second conductor film as the upper layer, there can be used, for example, W, Al, Cu, Mo, Ti, Ta, $WSi_2$, $MoSi_2$, $TiSi_2$, TiW and TiN.

Polycrystalline Si with a lower specific resistivity than that of the polycrystalline Si of the first conductor film may also be used.

For the deposition of the second conductor film, either of CVD or sputtering process may be used since the surface of the underlying material is planarized and the step is moderated.

Further, the wirings may also be formed by planarizing or moderating the hill and valley structure by using polycrystalline Si for the first conductor film, then forming a wiring pattern to the polycrystalline Si, forming thereover a layer of a metal that can be silicided as the second conductor film, for example, a layer of Ti, W, Mo, Ta, Pt and Co, siliciding the layer and, subsequently, removing the layer of unreacted metal.

The first conductor film as the lower layer of the wirings is used for improving the reliability of the contact connection and for planarizing or moderating the steps in the hill and valley structure.

Accordingly, although it is necessary that the material of the first conductor film should partially remain in the valleys of the underlying material, it may not necessarily remain on the hills so long as the second conductor film as the upper layer always remains on the hills.

Accordingly, in a case of using polycrystalline Si, for example, for the first conductor film, planarizing etching may be applied till polycrystalline Si on the hills is eliminated and $WSi_2$ may be deposited thereover, or polycrystalline may be deposited again after planarization and $WSi_2$ may be deposited further thereover.

The second conductor film as the upper layer is formed for lowering the wiring resistivity.

The present invention further provides:

a semiconductor memory device comprising a semiconductor substrate, a conductor disposed on the semiconductor substrate, an insulator disposed on the conductor and a buried film disposed between wordlines, the surface of the insulator disposed on the wordlines and the surface of the buried film disposed between the wordlines being substantially at an identical height and planar, and further comprises substantially planar data lines on the buried film and the insulator, a semiconductor memory device wherein a plate electrode is present on the data line, a semiconductor memory device, wherein the buried film is an insulator, a semiconductor memory device, wherein the buried film is a conductor, a semiconductor memory device wherein the plate electrode and the wiring conductor are isolated by insulation at an equal pitch with that for the memory cells, and further a method of fabricating a semiconductor memory device comprising a first step of forming wordlines by fabricating a first conductor disposed on a substrate and disposing a first insulator on the wordlines, a second step of forming a side wall spacer comprising a second insulator on the side walls of the wordlines, a third step of disposing the surface of the insulator disposed between the wordlines and surface of the wordlines such that they are substantially at an identical height and planar by burying the gap between the wordlines with a third insulator, a fourth step of etching a desired portion of the third insulator to expose a desired portion of the substrate and a fifth step of depositing a second conductor and a fourth insulator and forming datalines by anisotropically fabricating both of them, further, a method of manufacturing a semiconductor memory device wherein the first insulator and the second insulator comprise $SiO_2$ and the third insulator comprises $Si_3N_4$, further a method of manufacturing a semiconductor memory device wherein the fourth insulator comprises $SiO_2$, a method of manufacturing a semiconductor memory device wherein the first insulator and the second insulator comprise $Si_3N_4$ and the third insulator comprises $SiO_2$, a method of manufacturing a semiconductor memory device wherein the fourth insulator comprises $Si_3N_4$, a method of manufacturing a semiconductor memory device, wherein the fourth step is followed by a step of burying a third conductor in a hole formed by the etching of the third insulator and the step of embedding the third insulator is followed by the fifth step, further a method of manufacturing a semiconductor memory device, wherein the step of burying the third conductor is followed by a step of depositing a fifth insulator on the third conductor and a step of etching a desired portion of the fifth insulator thereby exposing a desired portion of the third conductor and the step is followed by the fifth step in which the second conductor is formed at least on a portion where the third conductor is exposed, a method of fabricating a semiconductor memory device comprising a step of forming wordlines of a desired pattern, a step of forming datalines of a desired pattern, a step of forming an insulator for protection film, a step of etching to remove the insulator for the protection film in a capacitor forming region, a step of forming a storage electrode of a capacitor into a desired pattern, a step of forming a capacitor insulator, a step of forming a plate electrode, a step of forming a contact hole to the insulator for the protection film outside of a memory cell region, a step of depositing a wiring conductor and a step of forming the wiring conductor into a desired pattern and, further a method of fabricating a semiconductor memory device, wherein the step of forming the wiring conductor into a predetermined pattern is followed by fabrication for the plate electrode into a pattern identical with the desired pattern.

The method of fabricating the semiconductor memory device described above can be carried out, for example, by substantially planarizing gaps between the wordlines in a memory cell region by using an etching back method (a method of depositing a CVD insulator and then applying etching substantially for the thickness of the film deposited, by which the space is filled and the underlying structure can be planarized substantially if the space is narrow and planarizing the data line.

In the method of fabricating the semiconductor memory device a memory cell capacitor is formed, for example, in a stage of the wiring forming step.

That is, by fabricating the plate electrode of the capacitor and depositing and fabricating a wiring conductor substantially thereafter, an interlayer insulator already present between the plate electrode and the wiring layer in a memory cell region is saved to attain the reduction of the step by so much as the film thickness.

The effective length of the datalines can be decreased by planarizing the datalines and, accordingly, effective resistance value and parasitic capacitance value of the datalines can be reduced.

On the other hand, in the memory cell region by forming a wiring layer directly on the plate electrode, there can be obtained an effect of reducing the step present so far in the memory cell by so much as the film thickness of the insulator.

Further, the present invention provides:

a semiconductor device having a wiring structure comprising a plurality of first wirings respectively disposed at a periodic repetition rate (or predetermined pitch) on a semiconductor substrate and second wirings respectively disposed at a periodic repetition rate (or predetermined pitch) on the first wirings by way of an insulator so as to cross the first wirings with respect to a plan view thereof, wherein the surface of the second wirings is substantially planar, the second wirings comprise two layers of conductor films of different materials, a semiconductor device, wherein the second wirings have a structure in which a metal layer or a metal silicide layer is laminated on a silicon containing conductor layer, a semiconductor device, wherein the silicon-containing conductor layer is formed within a groove defined by first wirings adjacent to each other and has a flat surface, a semiconductor device wherein the silicon-containing conductor layer comprises polycrystalline Si introduced with doping impurities, a semiconductor device wherein the first wirings are wordlines and the second wirings are data lines, a semiconductor device, wherein the semiconductor device is a dynamic type memory LSI having a combination of a MOS transistor and a capacitor as a minimum cell unit (or memory cell), the wordlines as the gate electrode wirings for the MOS transistor are the first wirings and the data lines connected to a first electrode of the MOS transistor are constituted with the second wirings, and a storage electrode of a capacitor is connected to the second electrode of the MOS transistor, a method of fabricating a semiconductor device, which comprises:

a step of forming first wirings as a gate electrode (wordline) of a MOS transistor, a step of covering the exposed portion of the first wirings with an insulator, a step of forming source and drain regions, a step of exposing a portion of a semiconductor substrate surface in the source region, a step of depositing, while introducing impurities, a first Si film having a thickness at least greater than one-half of a gap between adjacent wordlines, a step of entirely etching back the surface of the deposited first Si film thereby planarizing the surface, a step of depositing to laminate a metal or metal silicide, a step of applying a patterning fabrication to a laminate film of the first Si film and the metal or metal silicide thereby forming second wirings constituting the data lines, a step of covering the exposed portion of the second wirings with an insulator, a step of forming a first organic material over the entire surface, a step of selectively removing a predetermined region of the first organic material thereby forming a hole, a step of exposing a portion of the semiconductor substrate surface in the hole, a step of depositing a second Si film, a step of forming a second organic material over the entire surface, a step of etching back the entire surface of the second organic material thereby exposing the surface of the second Si film formed on the surface of the first organic material, a step of selectively removing the second Si film exposed on the first organic material, a step of entirely removing the first and the second organic materials selectively thereby forming a shield comprising the second Si film as a storage electrode of a capacitor, a step of forming a capacitor insulator, and a step of forming the other electrode of the capacitor, a method of fabricating a semiconductor device, wherein the organic material is an organic material capable of spin-coating on a substrate such as a polyimide resin, photoresist or EB resist, a method of manufacturing a semiconductor device, wherein the second Si film is an Si film formed by introducing impurities at the same time with the formation of the film, a method of manufacturing a semiconductor device, wherein the second Si film is an Si film introduced with impurities by means of ion implantation into Si formed in an amorphous state, a method of fabricating a semiconductor device, wherein a portion of the semiconductor substrate surface is exposed prior to the formation of the first organic material over the entire surface, the first organic material is subsequently formed over the entire surface and then the first organic material above the region in which the surface of the semiconductor substrate is exposed is removed to form a hole and further a method of fabricating a semiconductor device, wherein polycrystalline Si is formed on the pattern of the organic material formed by photoetching.

In the semiconductor device described above, when the second wirings disposed across the first wirings are constituted with a laminate film of the polycrystalline Si and the metal silicide, the polycrystalline Si in the lower layer is formed relatively thick so as to fill recesses formed between the first wirings and etched back to planarize the surface, and then the metal silicide is deposited to form a deposition film.

In the fabrication method of the semiconductor device described above, a pattern of the organic material is formed in the predetermined region, the underlying insulation layer is selectively eliminated by using the organic material as a mask for the etching to expose the conductor or the semiconductor and then the polycrystalline Si is formed in this state over the entire surface without removing the organic material.

Since the etching back planarization of the polycrystalline Si situated in the lower layer of the second wirings by can film the gaps formed between the first wirings and planarize the surface thereof, the metal silicide laminated to form as a substantial wiring layer can be formed into a planar surface.

As a result, since the metal silicide can be formed on the planar polycrystalline Si, the substantial wiring length can be shortened to lower the wiring resistivity according to the present invention, as compared with a case of not filling the grooves with the polycrystalline Si, in which the metal silicide is extended along the step formed by the first wirings and, accordingly, the wiring length of the metal silicide itself is increased and the resistivity can not be lowered.

Further, the organic material used for forming the capacitor portion can be formed or fabricated free from the effect of contaminations with the metal silicide present on the surface of the substrate.

In addition, since the organic material can be etched in the fabrication at a selectivity ratio which is infinitely greater as compared with inorganic materials used so far in semiconductor fabrication steps such as silicon dioxide ($SiO_2$) or silicon nitride ($Si_3N_4$) films, polycrystalline Si or Si substrates, even if such inorganic materials are present in the underlying material and the surface of the inorganic materials is exposed to a portion of the etching region in the course of the etching fabrication, only the organic material can be etched to eliminate selectively without etching such inorganic materials at all.

Further, it has been found that no plastic deformation is caused to the organic material itself, if heating and temperature elevation are applied in an atmosphere substantially free from oxygen.

Polycrystalline Si can be formed over the entire surface at a temperature of about 600° C. in a state where the organic material applied with patterning fabrication due to the effect of the organic material.

Further, in the prior art, the organic material has been used as a fabrication mask for the material underlying as typically represented by a photoresist applied with patterning by photolithography or an electron beam (EB) resist, and the organic material has been removed after the finishing of the fabrication to the underlying material.

It is one of the features of the present invention not to remove the organic material used as the mask for the fabrication of the underlying material but leave the organic material as it is and utilize it as a supporting base for forming inorganic materials such as polycrystalline Si.

A first object of the present invention is to provide a semiconductor device and a fabrication method therefor, capable of attaining two advantageous effects together, that is, lowering the resistivity of wirings on a hill and valley structure and improving the reliability of a contact connection.

The technique as described in U.S. Pat. No. 4970564 has succeeded in increasing the surface area of a storage electrode by using a structure in which data lines are laminated just above the wordlines.

However, as shown in a cross sectional view of FIG. 1 for the lamination capacitance type cell, since data lines 28 are formed conforming the surface of the hill and valley structure of the wordlines 23, the effective length of the datalines is increased to result in a problem of increasing the wiring resistivity of the data lines.

Further, since the side area of the data lines is remarkably increased, parasitic capacitance on the sides of the data lines formed between the side region and other electrode is remarkably increased.

Increase of the resistivity and the parasitic capacitance of the data lines results in a problem of lowering the signal reading speed or increasing noises.

Furthermore, since the technique disclosed above uses a structure in which the datalines and the storage electrode and, further, the plate electrode are laminated on the wordlines, there is also a problem that a step between the memory cell region and the peripheral circuit region is increased.

A second object of the present invention is to provide a semiconductor memory device and a fabrication method therefor capable of decreasing the effective length of the datalines and reducing the resistivity and the parasitic capacitance of the datalines.

A third object of the present invention is to provide a semiconductor memory device and a fabrication method therefor capable of reducing the step.

Along with the increase in the integration degree of LSI and the micro-miniaturization of individual elements used therefor, metal silicides as low-resistivity material have now been used more and more as the datalines, particularly, in order to suppress the increase of the resistivity of the datalines.

FIGS. 2(a)–2(h) show a schematic cross sectional views of an example of fabrication steps of a memory cell in a case of using a metal silicide for the datalines.

After forming a thick $SiO_2$ 212 as an isolation region on a Si substrate 211, an $SiO_2$ 213 as a gate insulator for a MOS transistor is formed and, subsequently, a gate electrode 214 as word lines is formed.

Thus, data lines comprising a laminate film of a polycrystalline Si 217 and a metal silicide 218 are formed, an exposed portion of the data lines is covered with an $SiO_2$ 219, then $SiO_2$ on the surface of the Si substrate is removed from a predetermined region in which a capacitor is to be formed, and a polycrystalline Si 220 is selectively grown from the exposed surface of the Si substrate (FIG. 2(a)).

An Si nitride film 221 and an $SiO_2$ 222 are laminated to form (FIG. 2(b)).

The $SiO_2$ 222 and the Si nitride film 221 are removed from a predetermined region forming a capacitor successively by means of lithography or anisotropic dry etching (FIG. 2(c)).

A polycrystalline Si 224 is formed (FIG. 2(d)).

An organic material 225, for example, a photoresist is spin coated over the entire surface and etched back entirely by dry etching to bury the organic material only in the valley, while leaving the polycrystalline Si 224 to be exposed on the surface of the hill (FIG. 2(e)).

The polycrystalline Si 224 exposed on the surface of the hill is selectively eliminated (FIG. 2(f)).

The organic material burying the valley is selectively eliminated to expose the polycrystalline Si 224 as a storage electrode of a capacitor (FIG. 2(g)).

A capacitor insulator 226 (extremely thin) and a capacitor electrode 227 are formed (FIG. 2(h)).

A memory cell can be constituted by way of successive steps as described above, and wirings are formed in subsequent steps to fabricate into an LSI.

In the technique as described above, it is intended to lower the resistivity by using a laminate structure of the polycrystalline Si and the metal silicide for the data lines but, if it is attempted to increase the integration degree, the resistivity of the data lines is increased relatively even by using such a structure, to result in a problem of the reducing the performance as LSI.

Further, since the metal silicide is used for the data lines, the metal silicide itself gives contaminations over the entire surface of the Si substrate which causes a remarkable reduction in the selectivity upon selective growth of Si conducted in the subsequent step to bring about a problem of reducing the yield.

A fourth object of the present invention is to provide a semiconductor device having a wiring structure intended for lowering the resistivity of wirings formed across the step.

A fifth object of the present invention is to provide a method of fabricating a semiconductor device capable of avoiding the problem that the selectivity is remarkably reduced when Si is caused to grow selectively on a substrate contaminated with the metal silicide, and capable of forming a d-RAM memory cell with simplified fabrication steps.

These and other objects and many of the attendant advantages of this invention will be readily appreciated as the same becomes better understood by reference to the following detailed description when considered in connection with the accompanying drawings.

BRIEF DESCRIPTION OF THE DRAWINGS

FIG. 7(a) is a cross sectional view of a peripheral circuit region in a semiconductor memory device as a fifth embodiment of the present invention, FIG. 7(b) and FIG. 7(c) are, respectively, cross sectional views of a memory cell region thereof.

FIGS. 12(a)-12(d) and 13(a)14 13(d) are, respectively, plan views for the improved layouts as the fifth embodiment according to the present invention;

DETAILED DESCRIPTION OF THE INVENTION

Figure 1:
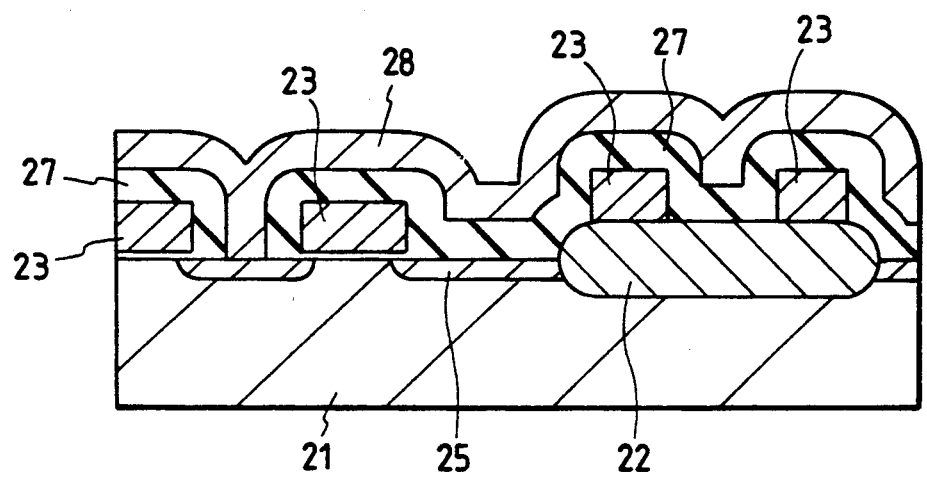
FIG. 1 is a cross sectional view for illustrating a subject to be dissolved by the present invention.
Figure 2A:
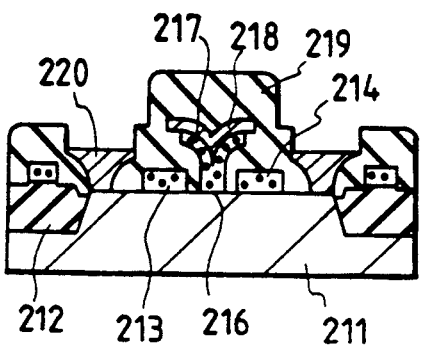
FIGS. 2(a)-2(h) are cross sectional view of fabrication steps for illustrating the subject to be discussed by the present invention.
Figure 2C:
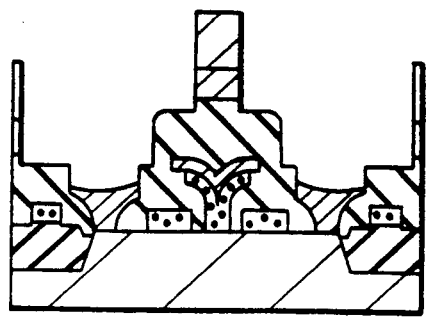
Figure 2B:
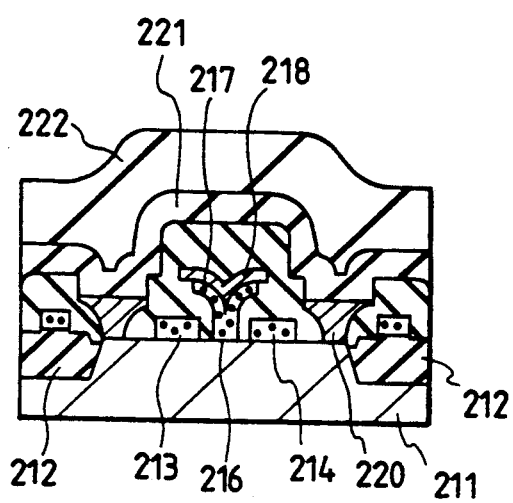
Figure 2D:
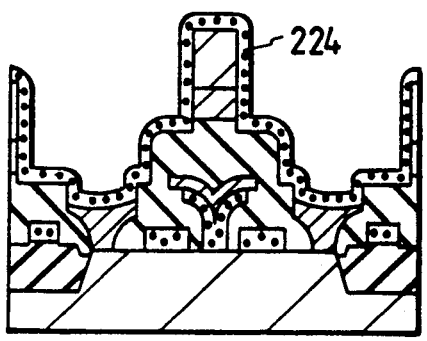
Figure 2E:
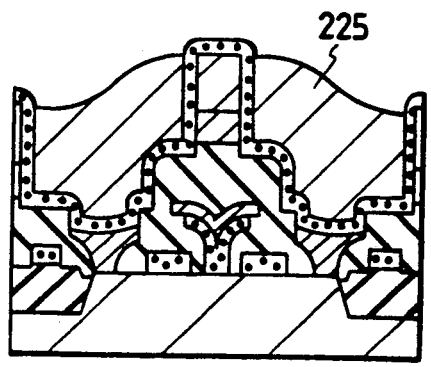
Figure 2F:
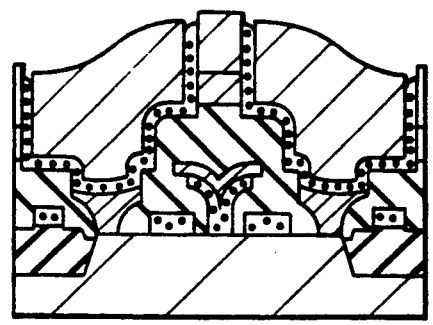
Figure 2G:
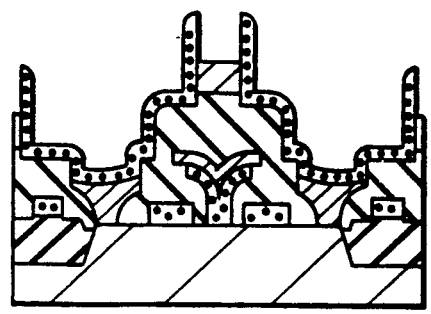
Figure 2H:
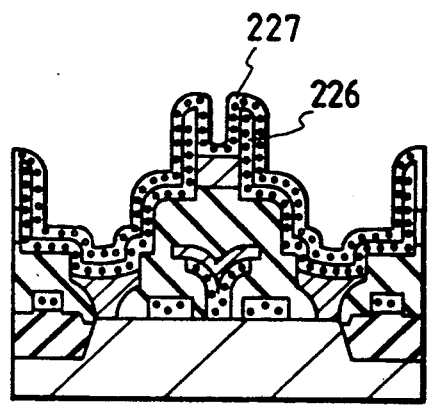

Descriptions will now be made with reference to the drawings but it should be noted that impurity regions are omitted or characteristic portions are emphasized, sometimes, in the drawings.

Embodiment 1

The first embodiment of the present invention will now be described referring to FIG. 3.

In FIGS. 3 through 6, are depicted a silicon substrate 101, an isolation region 102, a gate insulator 102', wordline 103, an opening 105, 203, an $SiO_2$ film 106, 106', a first conductor film 107 as a buried conductor, a second conductor film 108, polycrystalline Si 202, 301, 402, $WSi_2$ 302, 403, a gate polycrystalline Si 404 and an etching residue 405, respectively.

Figure 3:
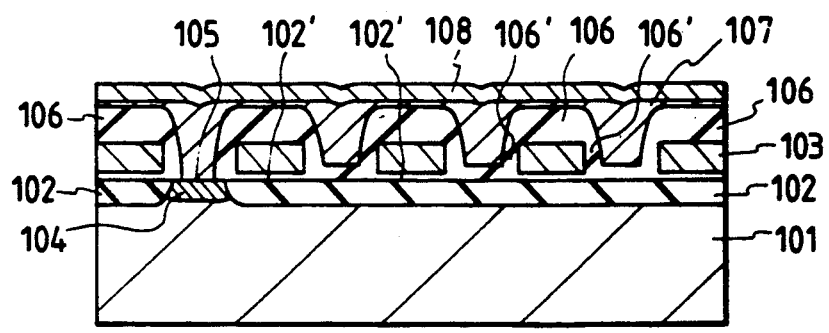
FIG. 3 is a cross sectional view illustrating a constitution of a first embodiment according to the present invention.

As shown in FIG. 3, an isolation region, for example, a silicon oxide film (hereinafter simply referred to as $SiO_2$ film) 102 for electrically isolating an element is at first formed to a thickness of 450 nm on a semiconductor substrate 101 of a desired conduction type, in this case, a p-type silicon (hereinafter referred to simply as Si), having a specific resistivity of 10 ohm.cm and, then, an $SiO_2$ film of 20 nm thickness is formed as a gate insulator 102' for a MOS type field effect transistor.

Then, a polycrystalline Si of 200 nm thickness as a gate electrode is formed and patterned by known lithography and etching so that wordlines 103 for a d-RAM memory cell comprising 1-transistor and 1-capacitor are formed.

The wordlines 103 are covered in a self-aligned manner with an insulator.

For this purpose, an $SiO_2$ film 106 is deposited to a thickness of 300 nm on the polycrystalline Si, then a resist pattern is formed by lithography on the $SiO_2$ film so as to form a mask for etching, the $SiO_2$ film is etched and then the polycrystalline Si is etched by using the $SiO_2$ film as a mask to form the wordlines 103.

Then, an $SiO_2$ film was deposited again over the entire surface to a thickness of 100 nm and then applied with anisotropic dry etching to leave an $SiO_2$ film 106' on the side walls of the wordlines 103.

Subsequently, an n type impurity layer 104 as a source and drain of a MOS type field effect transistor is formed by carrying out As ion implantation under the conditions at an acceleration voltage of 50 kV and at a dose of $2\times10^{15}$ cm$^{-2}$ and applying heat treatment at 900° C. for 10 min.

Then, an $SiO_2$ film is deposited again to a thickness of 70 nm, a resist mask having an opening is formed by using lithography and the $SiO_2$ film is etched by using the resist mask to form an opening 105.

In this state, the wordlines 103 are covered with $SiO_2$ films 106, 106' and the surface has a hill and valley structure as shown in FIG. 3, with the height of the step as high as about 500 nm.

Then, data lines are formed on them.

At first, polycrystalline Si is deposited to a thickness of 700 nm by a CVD process while doping phosphorus (P).

Then, it is etched for 600 nm of thickness by isotropic dry etching to form a polycrystalline Si for the first conductor film 107 of the data line.

With this etching, the first conductor film 107 as the buried conductor is buried in the opening 105, between the wordlines, etc. to planarize the surface.

Then, the second conductor film 108 comprising tungsten silicide ($WSi_2$) of 150 nm thickness is deposited on the first conductor film 107 by a sputtering process.

An $SiO_2$ film is deposited to 200 nm thickness over the $WSi_2$ conductor, on which a data line pattern is formed as a resist by lithography and the $SiO_2$ film, the second conductor film 108 and the first conductor film 107 are successively etched by using the resist as a mask to form the datalines. The datalines and the wordlines 103 are in a perpendicular arrangement with respect to each other, as shown in FIG. 3.

Subsequently, an $SiO_2$ film is deposited over the entire surface and a d-RAM having a lamination capacitance type d-RAM memory cell is fabricated by way of the steps such as providing an opening for attaining a connection between a charge storage electrode (not illustrated) and the n-type impurity layer of the Si substrate 101 of the memory cell, formation of the charge storage electrode (not illustrated), formation of a capacitor insulator (not illustrated), formation of a plate electrode of the capacitor (not illustrated), formation of a first passivation film (not illustrated), formation of a contact hole, formation of wirings, etc.

With the procedures as described above, a semiconductor device realized is comprised of a semiconductor substrate, a semiconductor element disposed on the semiconductor substrate and wirings disposed on a structure having hills in an underlying material and connected with the semiconductor element (for example, from the formation of the underlying layers), wherein the wirings comprise at least two layers of conductor films having a first conductor film as a lower layer and a second conductor film as an upper layer, in which the first conductor film having a surface moderating or planarizing the hills and valleys in the underlying material is obtained.

Figure 4:
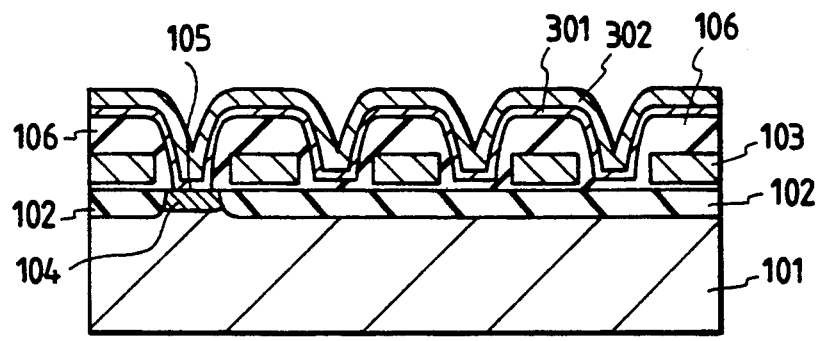
FIG. 4 is a cross sectional view for illustrating the effect of the first embodiment according to the present invention.

Then, FIG. 4 shows a cross sectional view in the course of fabricating the semiconductor device by the fabrication method as discussed by the present inventors earlier in this application.

After conducting the steps as far as the formation of the data lines in the same procedures as described above, a P-doped polycrystalline Si 301 of 100 nm thickness is formed, on which a $WSi_2$ film 302 of 150 nm thickness is formed by means of a sputtering or CVD process.

In this case, the data lines are formed on the wordlines 103 conforming to the steps thereof as shown in FIG. 4.

Comparing values standarized with the length and the width of the data lines when viewed as a plane, for the sheet resistance of the datalines, the sheet resistance of the data lines in the method shown in FIG. 4 is about 70 ohm, whereas the sheet resistance of that according to this example is as low as 15 ohm.

This is less than ¼ as that obtained by the method shown in FIG. 4.

In FIG. 4, the sheet resistance is large since the actual length of the dataline is increased as compared with the length when viewed as plane and since the step coverage of $WSi_2$ is not good.

The sheet resistance 15 ohm obtained in this embodiment is substantially the same as the value for a sheet resistance of a stacked film comprising 150 nm of $WSi_2$ and 100 nm of polycrystalline Si formed in a planar surface.

By reducing the sheet resistance of the data lines, d-RAM access time can be shortened by about 30%.

Embodiment 2

The second embodiment of the present invention will be described with reference to FIG. 5.

In the same procedures as those in the first embodiment, polycrystalline Si as a gate electrode is covered in a self-aligned manner to form an n-type impurity layer for source and drain (not illustrated).

Then, an $SiO_2$ film of 100 nm thickness is deposited to form an opening 203 above the polycrystalline Si 202 in the wiring portion above an isolation region 102 of a gate electrode.

Then, a polycrystalline Si is deposited to 700 nm thickness by a CVD process and the polycrystalline Si is etched for the thickness of 700 nm by means of isotropic dry etching.

Then, polycrystalline Si is again deposited to 100 nm thickness by a CVD process, P is ion implanted under the condition at an acceleration voltage of 50 kV and at a dose rate of $5 \times 10^{15}$ cm$^{-2}$ and, further, the polycrystalline Si is activated by an annealing at 900° C. for 30 min to obtain a first conductor film 107.

Then, after depositing a second conductor film 108 made of $WSi_2$ to 150 nm thickness by a sputtering process, a resist pattern is formed by lithography and a second conductor film 108 and the first conductor film 107 are anisotropically dry etched by using the pattern as the mask. The steps are shown in FIG. 5.

Figure 6:
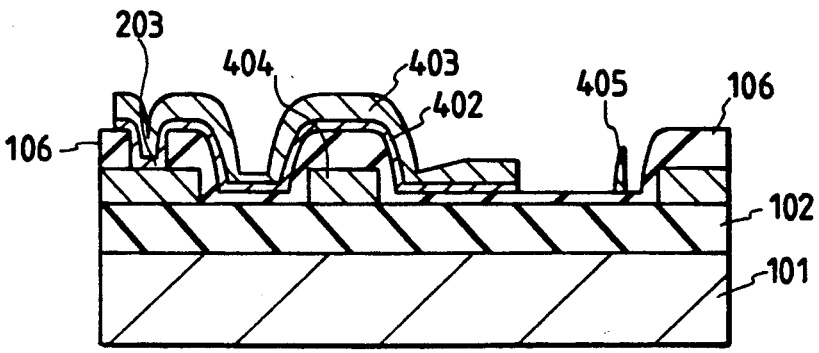
FIG. 6 is a cross sectional view for illustrating the effect of the second embodiment according to the present invention.

FIG. 6 shows a structure as discussed by the present inventors.

As shown in FIG. 6, after forming an opening 203, a polycrystalline Si 402 is formed to 100 nm thickness and activated, $WSi_2$ 403 is deposited to 150 nm by means of a sputtering process, a resist pattern is formed by a lithography and $WSi_2$ 403 and the polycrystalline Si 402 are anisotropically dry etched by using the pattern as a mask.

In this case, $WSi_2$ is deposited in a overhang shape at the step of the gate polycrystalline Si 404.

Accordingly, when $WSi_2$ is anisotropically dry etched, an etching residue 405 is formed as shown in FIG. 6 and wirings of $WSi_2$ and the polycrystalline Si are short circuited at the step of the gate polycrystalline Si.

Figure 5:
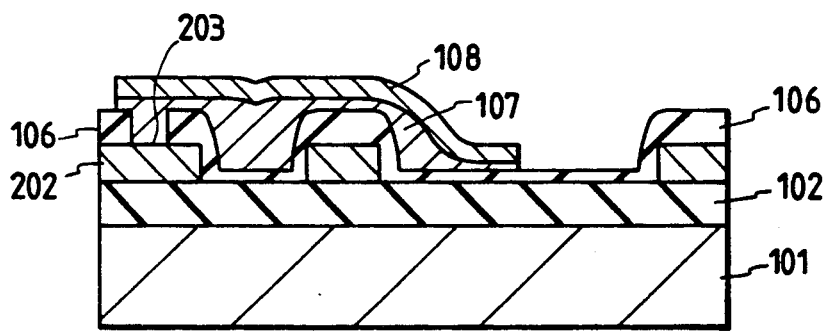
FIG. 5 is a cross sectional view illustrating a constitution of a second embodiment according to the present invention.

In FIG. 5 using the fabrication method according to the present invention, the second conductor film 108 does not form an overhang at the step of the gate polycrystalline Si, to cause no short circuitting.

After fabricating wirings comprising a stack of $WSi_2$ and polycrystalline Si films, a passivation film is formed, and opening, Al wiring, etc. are applied thereto, to fabricate an LSI comprising a MOS type field effect transistor.

According to the application of the present invention, since short-circuit of wirings no more occur between the WSi$_2$ and the polycrystalline Si and fine gaps between the gate polycrystalline Si is planarized, Al wirings do not cause short circuit to attain a preferred production yield for LSI.

Embodiment 3

The same procedures as those in Embodiment 1 are conducted as far as the formation of the datalines and then a polycrystalline Si layer as a first conductor film is formed to a thickness of 700 nm.

The first conductor film is etched for a portion of 600 nm thickness to planarize hills and valleys in the underlying material and is further fabricated into a desired wiring pattern.

Tungsten W is deposited on the first conductor film, then, W on a portion of the first conductor film is silicided by heating to prepare a second conductor film.

An unreacted portion is removed to form a wiring pattern of low resistivity.

Substantially the same effects can also be obtained by using other metals than W that can be formed into silicides such as Ti, Mo, Ta, Pt and Co.

Embodiment 4

The same procedures as those in Embodiment 1 are conducted as far as the formation of the dataline and then the polycrystalline Si layer as a first conductor film is formed to a thickness of 700 nm.

The first conductor film is etched for a portion of 600 nm thickness to planarize hills and valleys of underlying material and is further fabricated into a desired wiring pattern.

W is selectively deposited on the first conductor film by means of a CVD process to prepare a second conductor film and then formed into a wiring pattern.

Selective deposition can also be attained by using Al instead of W.

The present invention is not restricted only to the embodiments described above but various modifications are possible within a range not departing the gist of the present invention.

For instance, in Embodiments 1 and 2, the material for the first conductor film is not restricted only to the polycrystalline Si but similar effects can also be obtained by using W or TiN as the conductive material having good step coverage by means of a CVD process.

Also, the material for the second conductor film is not restricted only to WSi$_2$, but similar effects can also be obtained by using MoSi$_2$, W, TiN, Mo or Al.

According to the present invention, since a structure in which a low resistivity material is deposited on a planarized hill and valley structure can be obtained, the resistivity of the wiring can be reduced.

This can also increase the operation speed of LSI.

Further, since electric connection with the underlying material is made by the first conductor film as the lower layer having a good coverage, the reliability in the electric connection can be increased.

Further, since the thickness of the insulator to be etched upon opening for electric connection is substantially uniform, etching for the formation of the opening can be applied with ease.

Furthermore, since the material for the first conductor film of a good step coverage is isotropically etched to obtain a structure in which steps are moderated and the second conductor film comprising the low resistivity material is formed thereover, there is an advantageous effect that the no overhangs are formed on the surface and there is no etching residue in the step portion in the wiring fabrication, to eliminate short circuit of wirings.

Embodiment 5

The fifth embodiment of the present invention will now be described with reference to FIG. 7.

FIG. 7(b), (c) are cross sectional views for a memory cell region in the fifth embodiment of a semiconductor memory device according to the present invention and FIG. 7(a) is a cross sectional view for a peripheral circuit thereof.

Figure 7D:
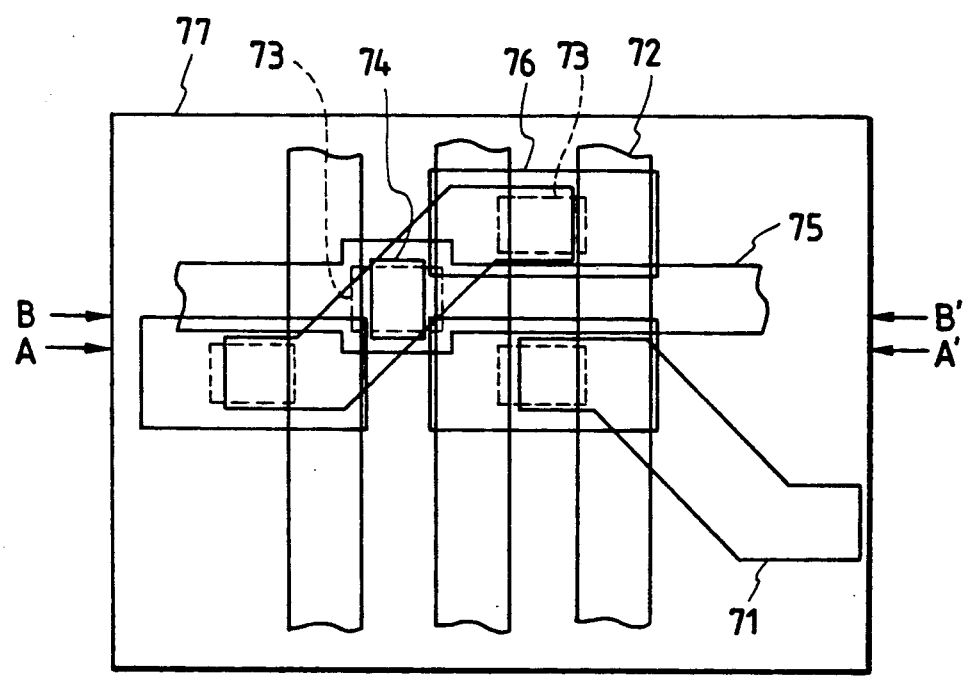
FIG. 7(d) is a view showing an arrangement thereof.

Further, FIG. 7(d) is a view for the arrangement of the device, in which a cross section taken along line A—A' corresponds to FIG. 7(c) and a cross section taken along line B—B' corresponds to FIG. 7(b).

In FIG. 7(a) through FIG. 13, are depicted a support substrate, specifically, a p-type Si substrate 11, 21, an insulation region specifically, an SiO$_2$ region 12, 12, a conductor film, specifically, polycrystalline Si 13, 56, 63, a storage electrode 14, 27, 76, an impurity region, specifically, an n-diffusion layer 15, 25, a plate electrode 16, 26, 77, an insulator film, specifically, SiO$_2$ 17, 27, 51, 52, 54, 61, 64, 105, 106, a data line 19, 28, 75, a wordline 23, 72, a gate electrode 41, 101, Si$_3$N$_4$ 53, Si$_3$N$_4$ 102 as buried film, a resist 55, a resist pattern 62, 65, active region 71, hole pattern 73, 74, a dummy wordline 81, a capacitor insulator film 103 and a wiring conductor 104, respectively.

As shown in the figures, in the memory cell region, since gaps between wordlines (in the subsequent descriptions, "wordline" sometimes means including also the insulator films disposed at the periphery of the wordline as well as the wordline per se for the convenience of the description) are substantially made planar with the insulator films to planarize the data lines and the resistance and the parasitic capacitance of the data lines can be reduced simultaneously.

Further, in the memory cell region, the plate electrode 16 of a capacitor is fabricated and, the wiring conductor 104 is deposited, so that the interlayer insulators present so far between the plate electrode and the wiring layer is eliminated.

Accordingly, the step between the memory cell region and the peripheral circuit region is reduced by so much as the film thickness of SiO$_2$ (for example, 0.5 $\mu$m).

FIG. 8 is a cross sectional view of an element for illustrating fundamental steps of fabricating a semiconductor memory device according to the present invention shown in FIG. 7.

Figure 8A:
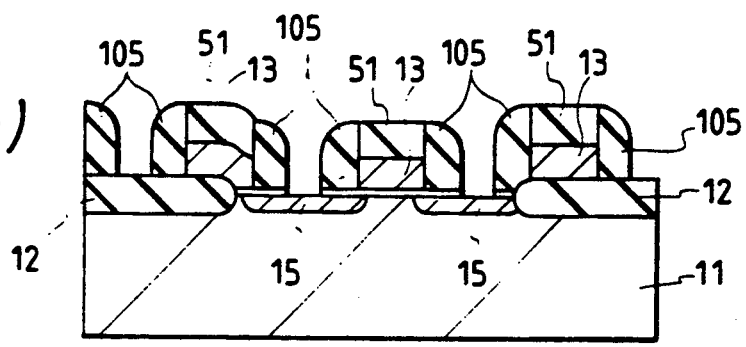
FIGS. 8(a)-8(l) are cross sectional views of an element illustrating fabrication steps of a semiconductor memory device as a fifth embodiment according to the present invention shown in FIG. 7.

As shown in FIG. 8(a), a p-type Si substrate 11 is used and an SiO$_2$ region 12 for isolation is formed at the surface of the substrate by using a known isolation fabrication technique.

Successively, a polycrystalline Si 13 of 150 nm thickness and an SiO$_2$ 51 of 200 nm thickness are formed respectively by a chemical vapor deposition process (CVD process), to form word lines of a laminate structure.

Further, an SiO$_2$ 105 of 150 nm thickness is deposited by using a CVD process and fabricated anisotropically to form a side wall spacer of SiO$_2$ 105 on the side wall of the wordline.

Then, P is ion implanted at an acceleration voltage of 25 KeV and at a dose rate of $1 \times 10^{13}$/cm$^2$ to form an n-type diffusion layer 15.

Figure 8B:
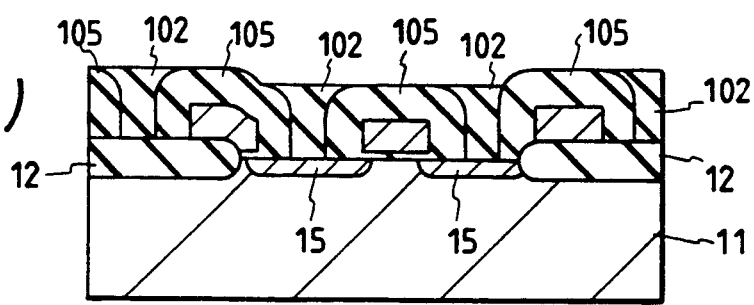

Then, as shown in FIG. 8(b), an $Si_3N_4$ 102 of is deposited to 400 nm thickness by using a CVD process and etched for a portion of the film thickness to bury $Si_3N_4$ 102 as a buried film between the wordlines.

The $Si_3N_4$ 102 at a portion in which the n-type diffusion layer 15 on the surface of the substrate is to be in contact with the data line is etched by using a resist pattern (not illustrated).

Figure 8C:
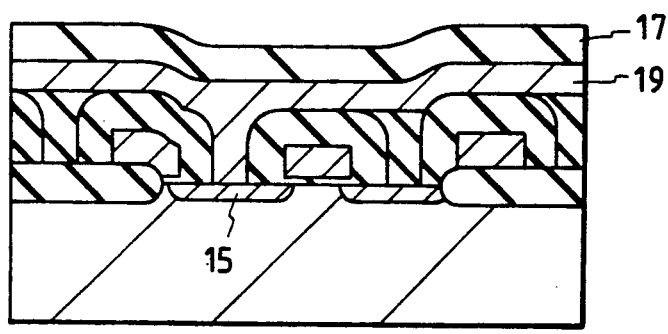

Successively, a polycrystalline Si of containing n-type impurity is deposited to 200 nm thickness to form a data line 19 by using a CVD process and, further, an $SiO_2$ 17 is deposited to 200 nm thickness by using a CVD process (FIG. 8(c)).

As the data line, a low-resistivity high melting metal silicide such as $WSi_2$, $TiSi_2$ or $PtSi_2$ or a laminate film thereof may be used instead of the polycrystalline Si.

The $SiO_2$ 17 and the data line 19 are anisotropically fabricated by using a resist pattern (not illustrated) to form the data lines of a desired pattern.

Figure 8D:
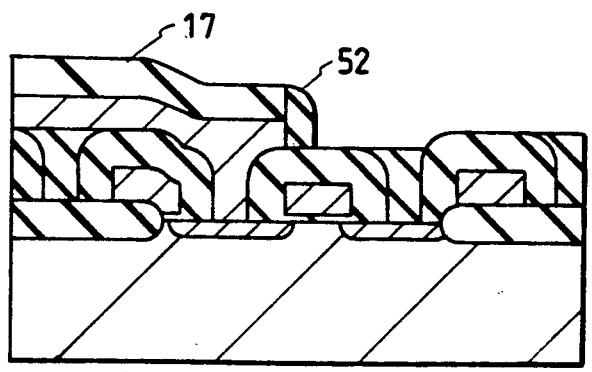

Then, an $SiO_2$ 52 is deposited to 150 nm thickness by using a CVD process and then etched by anisotropic dry etching to form an $SiO_2$ side wall spacer on the side wall of the dataline to insulate the dataline (FIG. 8(d)).

Figure 8E:
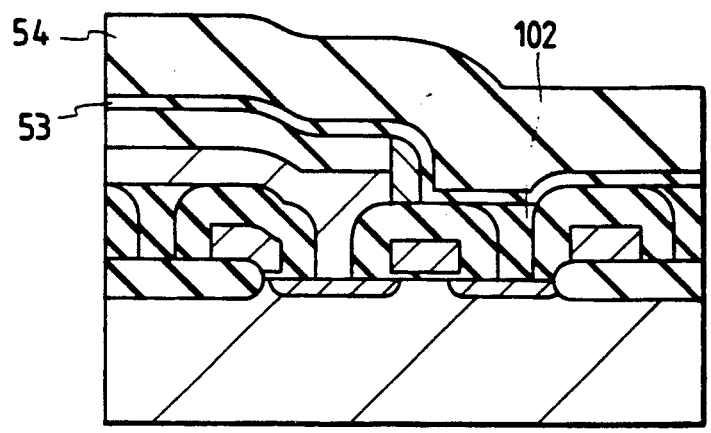

An $Si_3N_4$ 13 of 50 nm thickness and an $SiO_2$ 54 of 300 nm thickness are, respectively, deposited by means of a CVD process (FIG. 8(e)).

After anisotropically etching the $SiO_2$ 54, $Si_3N_4$ 53 and $Si_3N_4$ 102 by using a resist pattern not illustrated, a polycrystalline Si 56 containing an n-type impurity is deposited to 50 nm thickness by a CVD process.

Figure 8F:
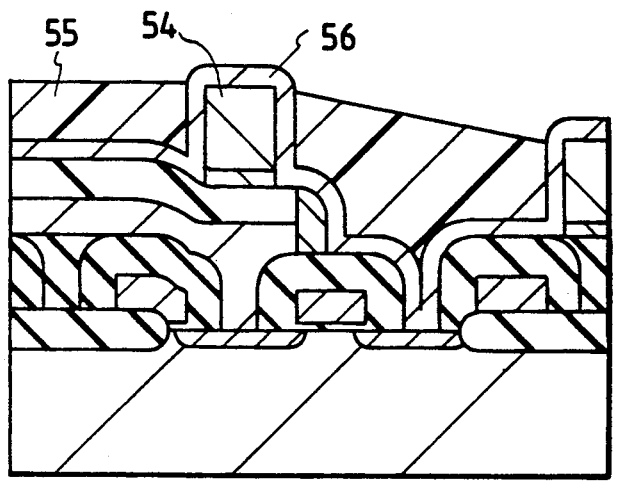

A resist 55 is buried within a recess (FIG. 8(f)).

The polycrystalline Si 56 is not covered with the resist 55 is anisotropically etched, then the resist 55 is eliminated and, further, the $SiO_2$ 54 on the memory cell region is eliminated to form the polycrystalline Si 56 as a storage electrode 14.

Subsequently, $Ta_2O_5$ is deposited to form a capacitor insulator film 103.

For the capacitor film 103, $Si_3N_4$, $SiO_2$, a ferroelectric material or a composite film thereof can be used.

Successively, W is deposited to form a plate electrode 16.

For the plate electrode 16, low resistive conductor such as high melting metal, high melting metal silicide, TiN, Al or Cu other than the polycrystalline Si and W can be used.

Figure 8G:
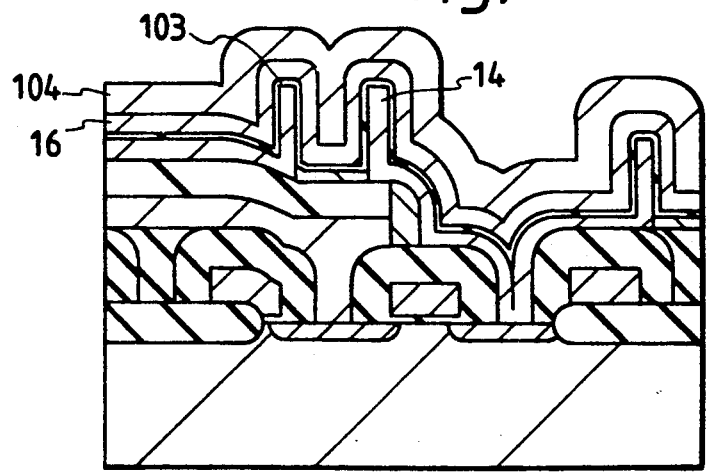

Further, a wiring metal 104 is laminated on the plate electrode (FIG. 8(g)).

In the fabrication steps from FIGS. 8(a) to (g) described above, the following structure shown in FIG. 8(h) to (l) are formed in the region other than the memory cell region.

Figure 8H:
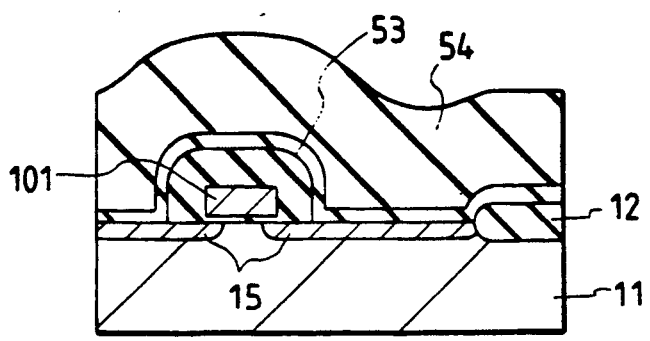
Figure 8I:
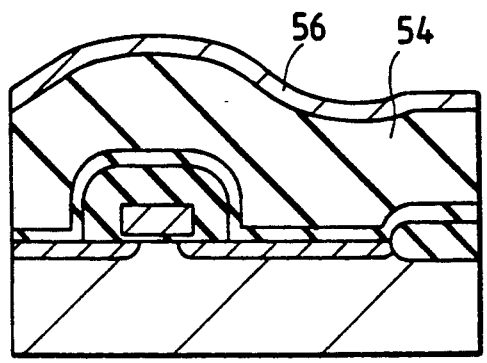

In a case where the structure shown in FIG. 8(e), (f) is formed in the memory cell region, a structure shown in FIG. 8(h), (i) is formed correspondinly in the peripheral circuit region.

That is, an $Si_3N_4$ 53, and $SiO_2$ 54 and a polycrystalline Si 56 are formed on a gate electrode 101.

Figure 8J:
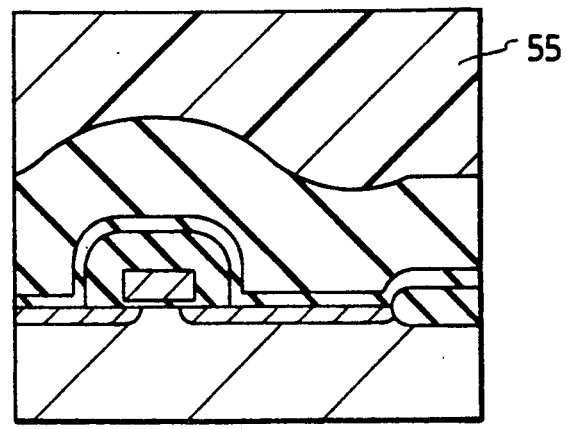

Then, during formation of the structure shown in FIG. 8(g) in the memory cell region, a structure shown in FIG. 8(j), (k) and (l) is formed in the peripheral circuit region.

In a state where the storage electrode is formed on the memory cell region shown in FIG. 8(g), the polycrystalline Si 56 has been etched and no more present in the peripheral circuit region as shown in FIG. 8(j).

Figure 8K:
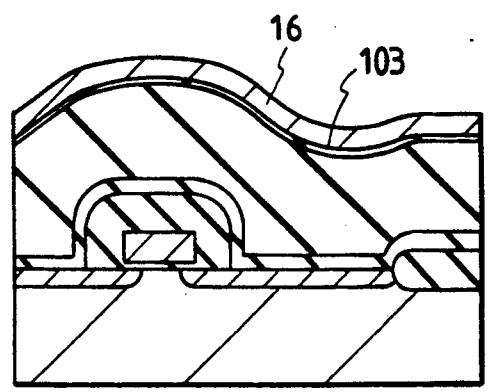
Figure 8L:
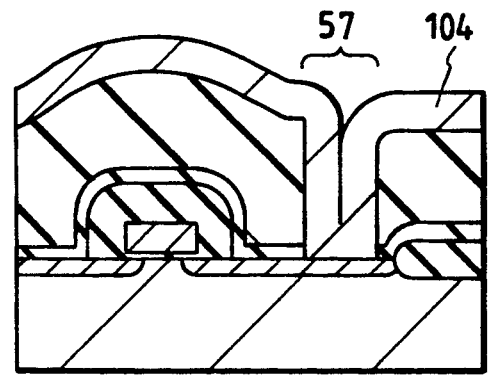

After depositing a capacitor insulator film 103 and a plate electrode material 16 (FIG. 8(k)), the plate electrode 16 is etched and, successively, a contact hole 57 is opened and a wiring material 104 is deposited (FIG. 8(l)).

By using the steps as described above, a semiconductor memory device having a structure equivalent to that shown in FIG. 7 can be formed.

The embodiment to be described next shows a fabrication method avoiding the difficulty for fabricating an extremely thick $Si_3N_4$ film ($Si_3N_4$ 102 in FIG. 8(e), (f)) upon forming the storage electrode.

Figure 9A:
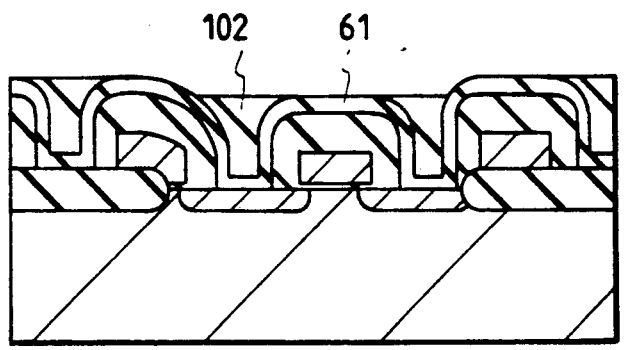
FIGS. 9(a)-9(c) are cross sectional views of an element for illustrating different fabrication steps.

After forming the structure in FIG. 8(a), an $SiO_2$ 61 of 50 nm thickness and an $Si_3N_4$ 102 of 400 nm thickness are respectively deposited by a CVD process, and the $Si_3N_4$ 102 is etched by the thickness of the film to form a structure shown in FIG. 9(a).

Figure 9B:
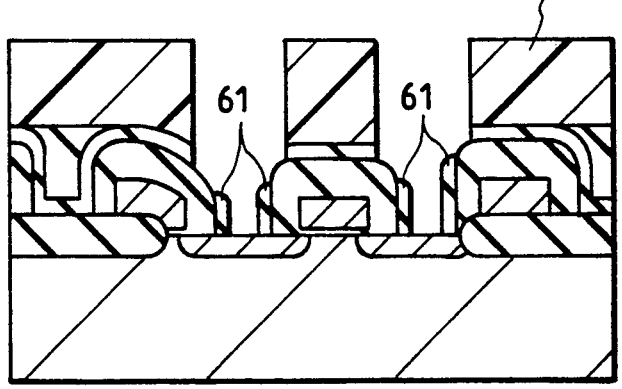

The $Si_3N_4$ 102 and the $SiO_2$ 61 are anisotropically etched from a portion in which the n-type diffusion layer on the surface of the substrate and the data lines are to be connected electrically and from a portion in which the n-type diffusion layer on the surface of the substrate and the storage electrode are to be electrically connected by using a resist pattern 62 (FIG. 9(b)).

A polycrystalline Si containing n-type impurity is deposited to 400 nm thickness by using a CVD process, and etched substantially for the film thickness and a polycrystalline Si 63 is buried to the inside of a hole formed by the etching.

Figure 9C:
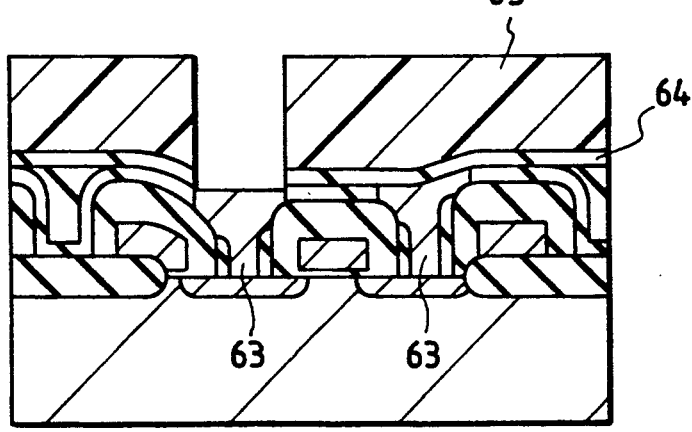

Then, after depositing an $SiO_2$ 64 to 50 nm thickness by a CVD process, only the portion of the $SiO_2$ on a region in which the n-type diffusion layer on the surface of the substrate and the data line are to be connected is etched by using a resist pattern 65 (FIG. 9(c)).

In this case, although a known etching back method is used for burying the polycrystalline Si 63, a selective CVD process or a selective epitaxial growing process (a method of selectively depositing Si only to the portion in which the Si surface is exposed) capable of obtaining a similar structure may also be used.

Subsequently, by using substantially the same fabrication method as those in FIG. 8(c) through (g), a memory cell equivalent with that in FIG. 7 can be formed.

In this example, since a structure in which the polycrystalline Si 63 is buried in a desired region between the wordlines is used, thick $Si_3N_4$ is no more present between the wordlines and, accordingly, this can avoid the difficulty of fabricating an extremely thick $Si_3N_4$ film upon forming the storage electrode.

In each portion in FIG. 8 and FIG. 9 described above, two kinds of insulator films $SiO_2$ and $Si_3N_4$ are used selectively.

The purpose of such selective use is for etching the insulator films at different etching rates, that is, for applying so-called selective etching.

Similar effects can also be obtained by replacing the materials for the two kind of films with each other.

In the example described above, explanations have been made to an example of using the electrode structure shown in the drawings with an aim of increasing the surface area of the storage electrode, but it will be apparent that the present invention is applicable also to a structure in which thin storage electrodes are stacked in a plurality of layers or a structure of having a storage electrode irrespective of the thickness.

Then, embodiments for the layout of the semiconductor memory device according to the present invention will be explained referring to FIG. 10.

FIG. 10 shows a system used generally at present for d-RAM, in which only one of two intersections formed between wordlines and data lines actually constitute a memory cell, that is, so-called 2-intersection/data system layout.

Figure 10A:
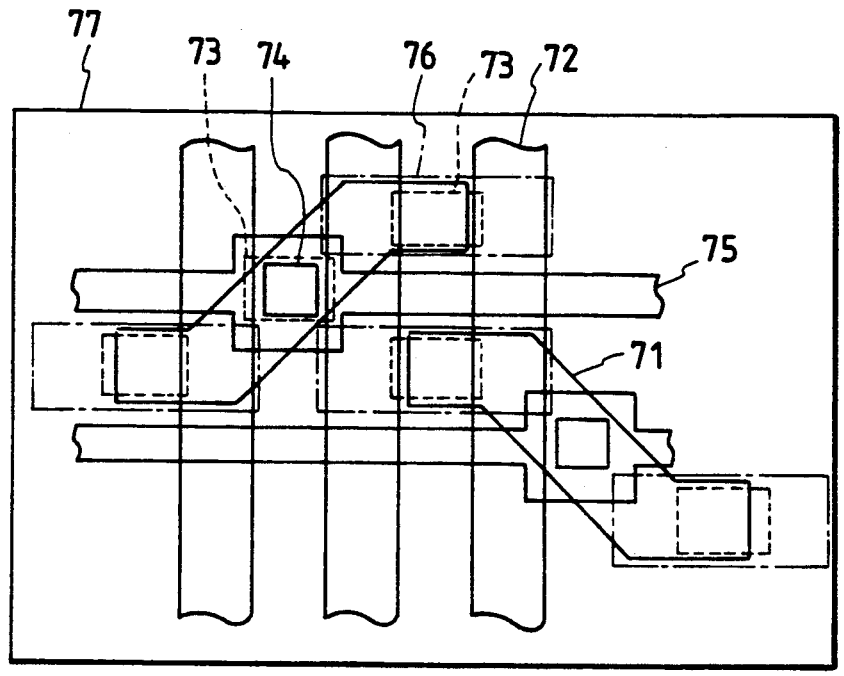
FIGS. 10(a) and 10(b) are plan views showing a layout for a semiconductor memory device as the fifth embodiment according to the present invention shown in FIG. 7.

FIG. 10(a) shows an embodiment of a layout in which an active region 71 is made orthogonal to wordlines 72 and the datalines 75.

The layout shown in the figure is applicable to any of two kinds of fabrication methods shown in FIG. 8 and FIG. 9.

In the figure, 73 denotes a hole pattern formed by etching the $Si_3N_4$ 102 and the $SiO_2$ 61 in the steps of FIG. 9(b).

74 denotes a hole pattern formed by etching the $Si_3N_4$ 102 in a connection region between the data line 19 and the n-type diffusion layer 15 shown in FIG. 8(c), and a hole pattern formed by etching the $SiO_2$ 64 in FIG. 9(c).

76 denotes a storage electrode and 77 denotes a plate electrode.

Figure 10B:
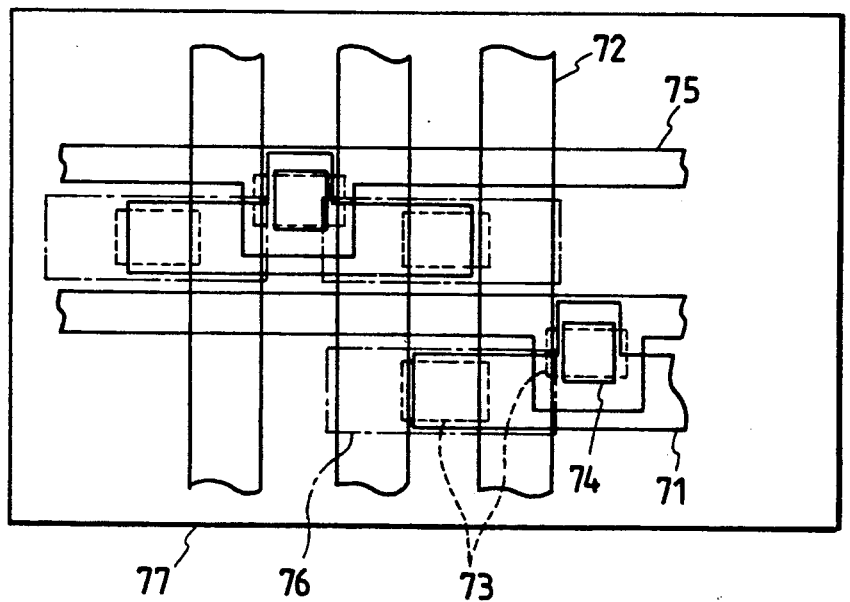

FIG. 10(b) shows an embodiment of a layout different from that shown in FIG. 10(a).

The fabrication steps for them are identical.

The layouts for both of them are different with respect to the shape of the active region 71.

In FIG. 10(b), the layout is different from that of FIG. 10(a) in that the active region 71 is substantially in parallel with the data line.

FIG. 11 shows a layout in which an intersection between a wordline and a dataline constitutes a memory cell, that is, so-called, intersection/data system layout.

Figure 11A:
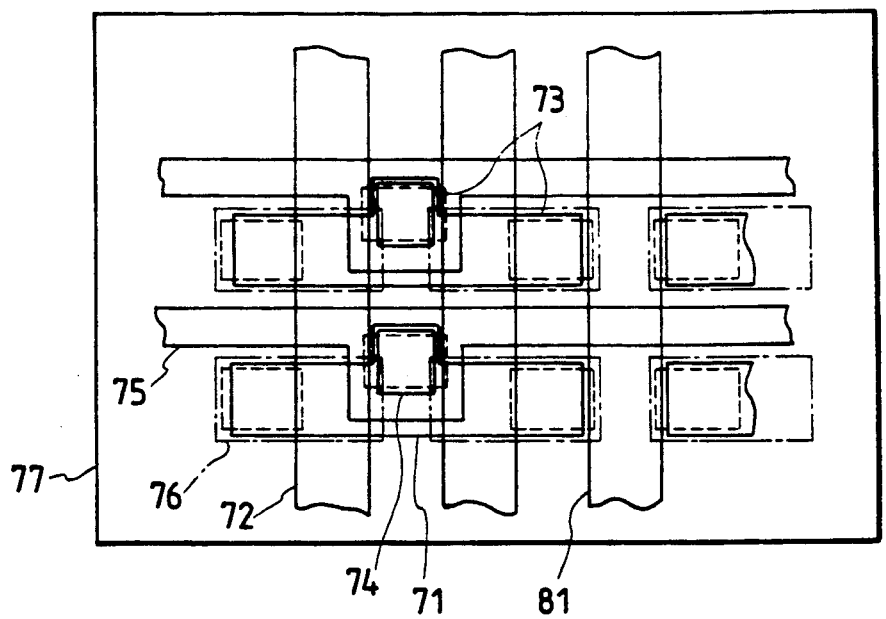
FIGS. 11(a) and 11(b) are plan views illustrating a different layout thereof.

The structures shown in FIG. 11(a) and (b) are identical with each other excepting that the structure of the active region 71 is different.

In these examples, a dummy wordline 81 is used mainly for keeping the wordline spaces substantially uniform in the memory cell region.

Figure 11B:
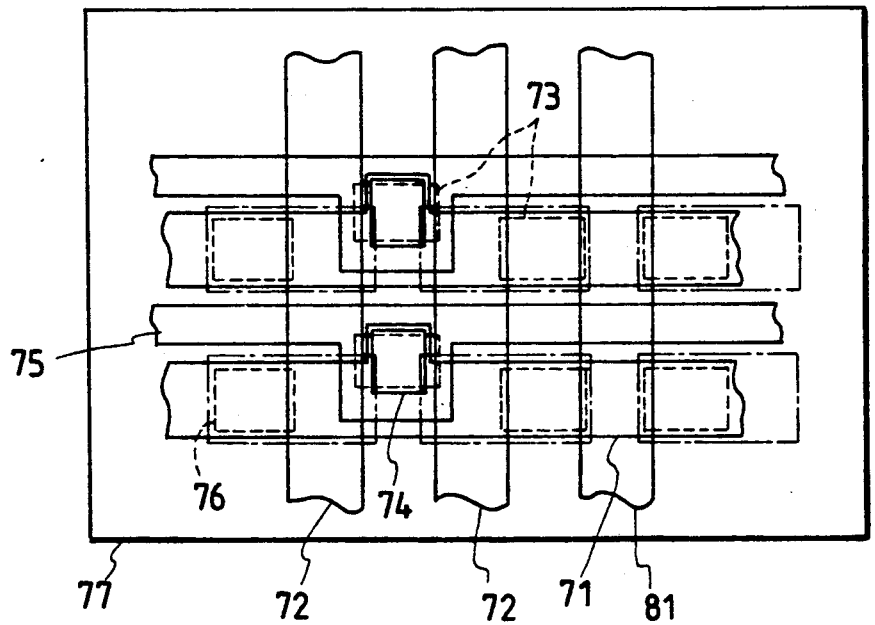

However, in FIG. 11(b), the dummy wordline 81 is used also as an isolation gate between adjacent MOS FET (metal oxide semiconductor field effect transistor).

That is, in FIG. 11(b), a MOS FET is constituted with the dummy wordline 71 and the active region 71 therebelow and, if the potential for the dummy wordline is set to less than the threshold voltage for the MOS FET, MOS FET can be cut off to prevent leak current from flowing between adjacent MOS FET.

Although the layouts shown FIG. 11(a) and (b) are different from the embodiment shown in FIG. 10, the fabrication method is identical with that of FIG. 10.

Figure 12A:
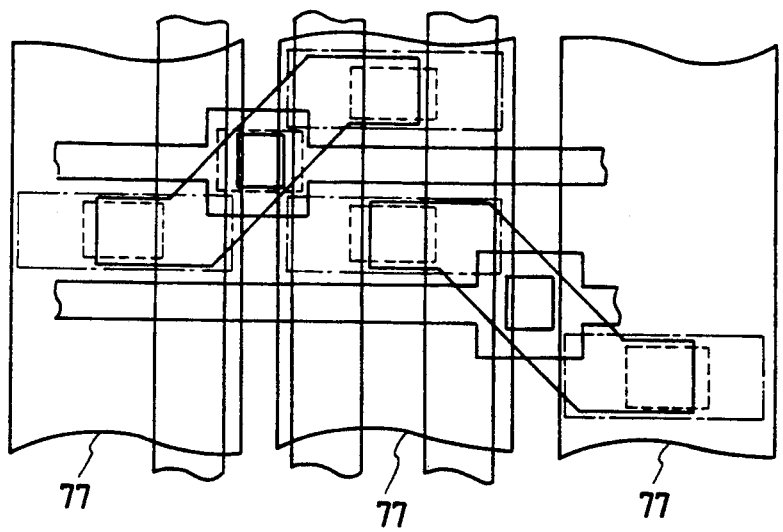
Figure 12B:
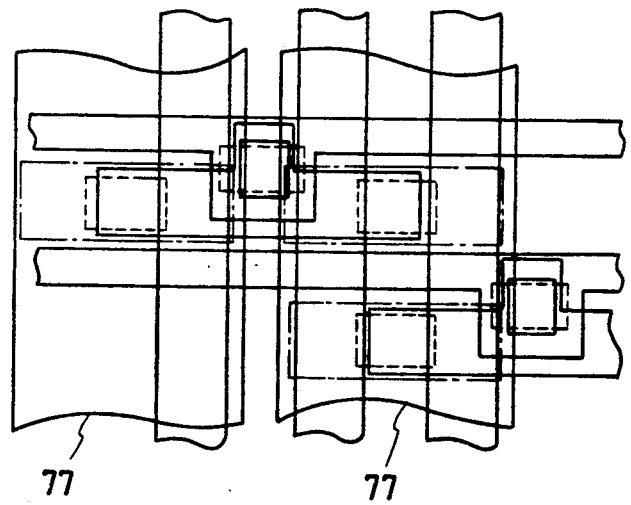
Figure 12C:
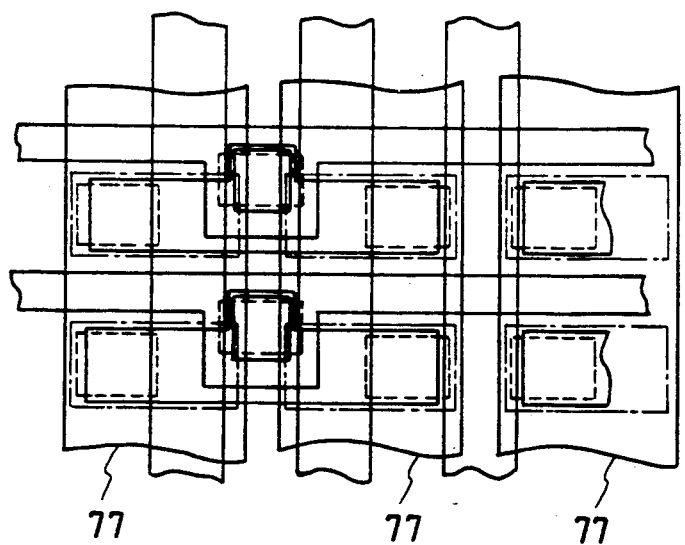
Figure 12D:
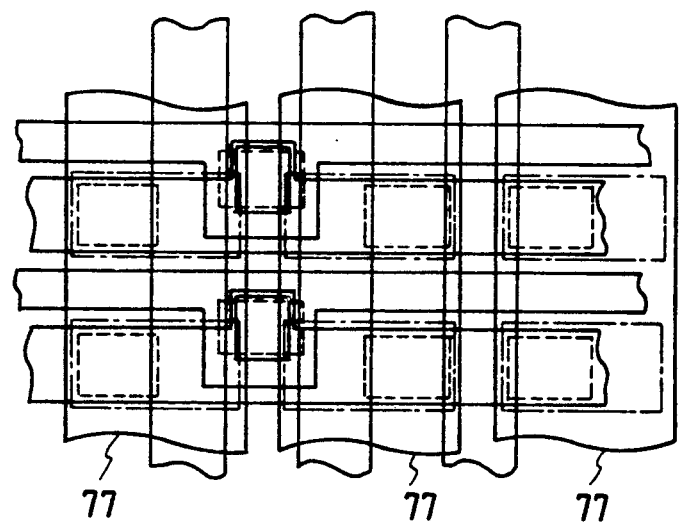

Layouts shown in FIG. 12(a), (b), (c) and (d) are, respectively, modifications for the layouts of the plate electrode 77 shown in FIG. 10(a), (b) and FIG., 11(a), (b).

Each of them has a structure in which the plate electrode is isolated in parallel with the wordline.

In these embodiments, the plate electrode has a structure in which the plate electrode material and the wiring material are laminated.

The structure of isolating the plate electrode is a system proposed in 1989 IEEE International Solid-State Circuits Conference, pp 238–239, that is, a structure capable of attaining a high S/N ratio (high signal-to-noise ratio (SNR)).

For attaining SNR, it is necessary to drive the potential of the divided plates at high speed.

Since the memory device according to the present invention has a structure in which the low resistivity layer used as the wirings in the peripheral circuits is laminated on the plate electrode, the wiring resistivity of the plate is low and it is suitable to high speed operation.

Figure 13A:
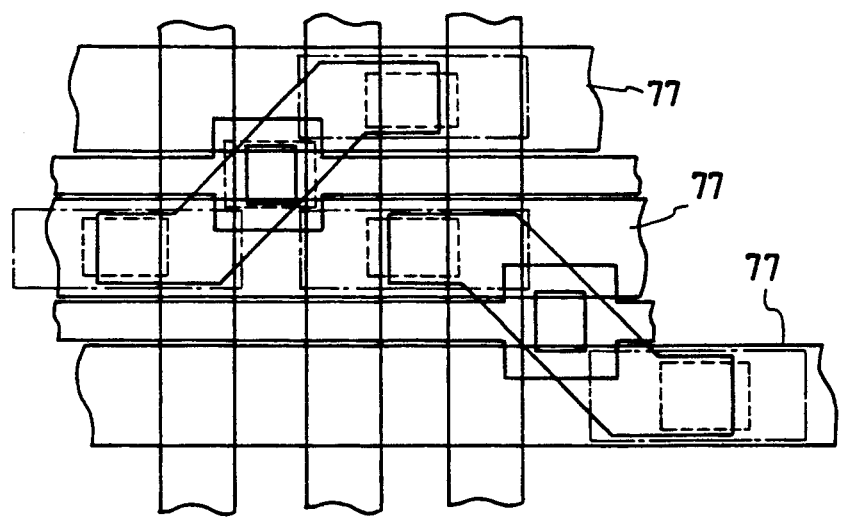

The layouts shown in FIG. 13(a), (b), (c), (d) provide respectively, modified layouts for the plate electrode 77 shown in FIG. 10(a), (b) and FIG. 11(a), (b).

Figure 13B:
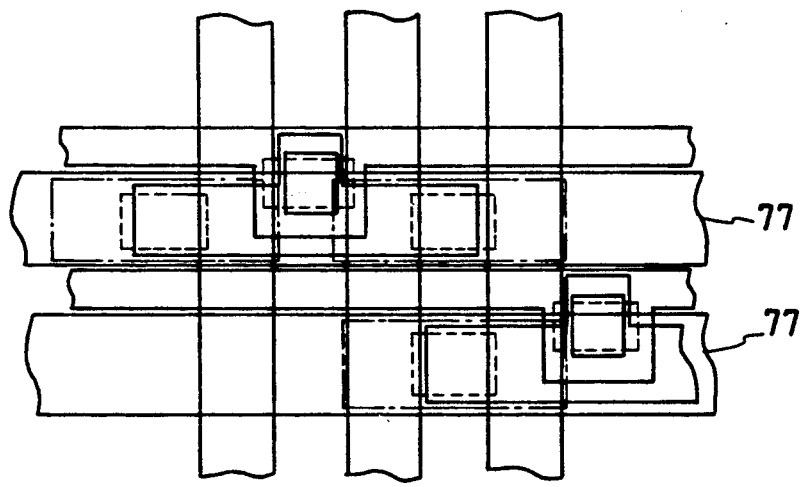

The four embodiments shown in FIG. 13 are different from the four embodiments in FIG. 12 in view of the layout of the plate electrode and have a structure in which the plate electrode is isolated in parallel with the data lines.

The effect is similar to that of the four embodiments in FIG. 2 and high S/N ratio can be attained.

In the semiconductor memory device by the fifth embodiment according to the present invention, the effective length of the data line is reduced to about 60% of that in the conventional semiconductor memory device by planarizing the data line and, accordingly, the resistivity and the parasitic capacitance of the data line can be reduced to about 60% of them in the conventional device.

Further, as a result of using a structure in which the wiring layer is directly deposited on the plate electrode, the plate electrode and the wiring layer can be formed substantially with an identical layer.

Accordingly, the insulator films present so far between the plate electrode and the wiring layer is saved and the step can be reduced by so much as the thickness thereof.

Accordingly, the step can be moderated by about 0.5 $\mu$m in the peripheral circuits.

Embodiment 6

In this embodiment, descriptions will be made to a method of forming wirings as one of the features of the present invention with reference to FIGS. 14 and 15.

In FIGS. 14 through 19, are depicted an Si substrate 1, 101, a gate insulator film 2, 102, wordlines 3, 103, an insulator film 4, 5, 104, a polycrystalline Si 105, an opening 203, a metal silicide 8, 106, a step 9, an impurity region 10, a contact portion 206 of the data line, a silicon oxide film 209, a polyimide resin 211, an opening 212, a contact hole 213 disposed to the opening, a polycrystalline silicon 214 as a conductor film and a conductor film 7, 207, 406 as a buried film, respectively.

FIG. 14 shows a method as discussed by the present inventor.

The $SiO_2$ 102 is formed to 20 nm thickness by thermal oxidation process on the Si substrate 101 and then the polycrystalline Si 103 is deposited to 350 nm over the entire surface by a vapor deposition process.

Further, the $SiO_2$ 104 is deposited to 100 nm thickness by a vapor phase deposition process.

The $SiO_2$ 104 and the polycrystalline Si 103 are fabricated by a well-known lithography and dry etching to form a periodical wiring pattern corresponding to the d-RAM word lines.

The width of the wirings is set to 0.5 $\mu$m while the wiring gap is set to 1 $\mu$m.

Then, after covering the exposed side wall of the polycrystalline Si 103 with the $SiO_2$ 104, the polycrystalline Si 105 and the metal silicide 106 corresponding to the data line are formed.

At first, the polycrystalline Si 105 is deposited to 20 nm thickness by a vapor phase deposition process.

Then, the metal silicide 106 is deposited to 150 nm thickness by a sputtering process.

Figure 14A:
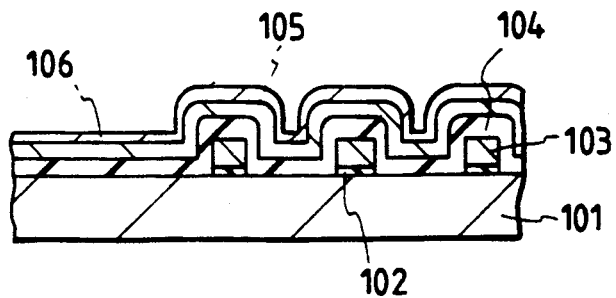
FIGS. 14(a) and 14(b) are cross sectional views for illustrating the problems discussed hereinabove by the present inventors.

The state is shown in FIG. 14(a).

In the wiring structure in which the metal silicide 106 is deposited on the polycrystalline Si 105, the wiring resistance can be lowered by about one digit as compared with the case of using the wiring Si 105 alone.

This is because the resistivity of the metal silicide is as low as about $1 \times 10^{-4}$ ohm.cm as whereas the resistivity of the polycrystalline Si is about $1 \times 10^{-3}$ ohm.cm.

Accordingly, the actual wiring resistivity depends on the resistivity of the metal silicide layer 106.

In this discussed case, a d-RAM, for instance, can be applied sufficiently to a 4 MB LSI, but application to an LSI of higher integration degree is difficult, because the wiring resistivity is increased due to the increase of the wiring length.

Figure 14B:
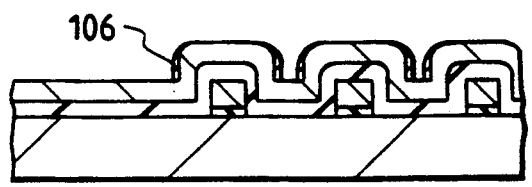

Another problem in this discussed case is that the metal silicide 106 is liable to remain in the step upon fabricating the laminate film into wirings as shown in FIG. 14(b) and, accordingly, the polycrystalline Si 105 therebelow remains unetched tending to cause interwiring short-circuit.

An embodiment that embodies one of the features of the present invention will be explained with reference to FIG. 15.

An $SiO_2$ 2 of 20 nm thickness is formed by a thermal oxidation process on the surface of an Si substrate 1, a polycrystalline Si 3 of 350 nm thickness is deposited thereover by a vapor deposition process and, further, an $SiO_2$ 4 of 200 nm thickness is deposited by a vapor deposition process.

Then, periodical wirings corresponding to wordlines are fabricated by lithography and dry etching and, further, an $SiO_2$ 5 of 100 nm thickness is deposited by a vapor deposition process.

Since it is necessary that the $SiO_2$ 5 be deposited so as not to form overhangs at the stepped portion, $SiH_4$ (monosilane) and $N_2O$ (dinitrogen monoxide) are used within a temperature range of 750° C. to 800° C. as the conditions for the vapor deposition (the conditions are used for all of $SiO_2$ vapor deposition described subsequently).

Figure 15A:
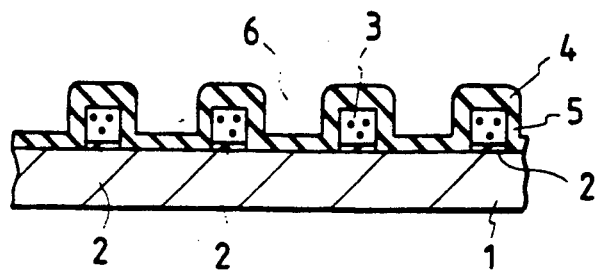
FIGS. 15(a)-15(e) are cross sectional views of successive fabrication steps showing the sixth embodiment according to the present invention.

As a result, a groove 6 having a vertical side wall is formed (FIG. 15(a)).

The procedures so far are the same as those in the case discussed above.

Figure 15B:
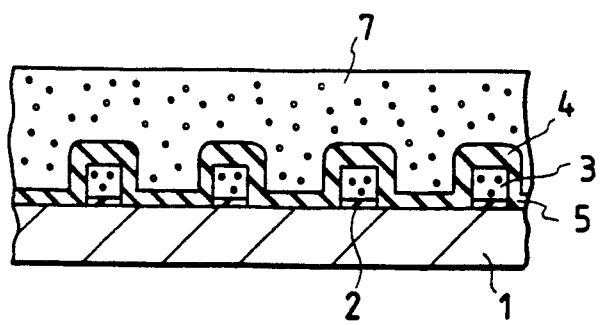

Then, a polycrystalline Si 7 as a buried film is deposited to a thickness sufficiently greater than one-half of the width of the groove 6 by a vapor deposition process so as to completely fill the groove 6 (FIG. 15(b)).

Then, the polycrystalline Si 7 is etched back for the entire surface to reduce the entire thickness and planarize the surface.

Figure 15C:
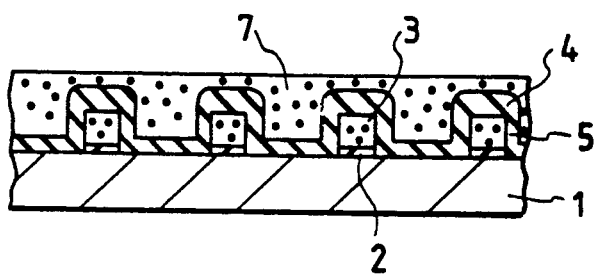

The etching back used herein may be a wet process etching, but a dry etching process using a halogen gas provides good controllability (FIG. 15(c)).

Figure 15D:
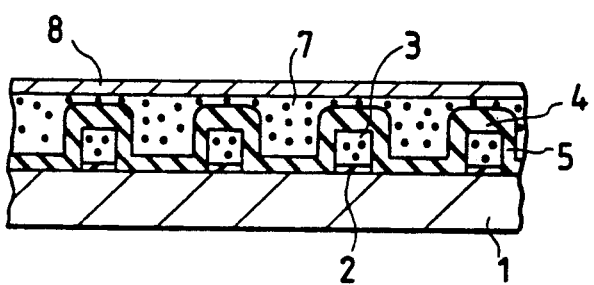

Subsequently, a tungsten silicide (WSi) 8 of 150 nm thickness is deposited as a metal silicide by a sputtering process (FIG. 15(d)).

In this embodiment, the step present in the underlying material can be eliminated to attain planarization by etching back the polycrystalline Si formed as a thick layer and, as a result, WSi can be formed as substantially planar wirings.

Accordingly, as compared with the discussed case shown in FIG. 14 in which wirings are formed just conforming with the steps of the underlying material, the wiring length can be shortened by so much as the steps are eliminated and there is obtainable an effect of lowering the wiring resistivity.

Further, since the WSi is formed planar, fabrication becomes facilitated to eliminate the occurrence of etching residue.

Figure 15E:
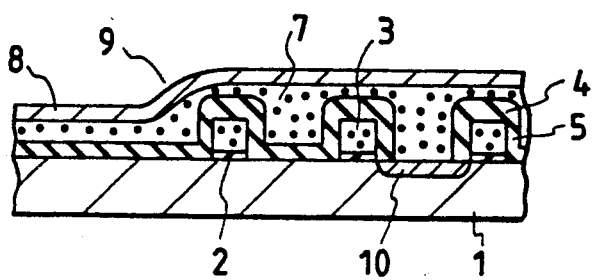

Further, in an actual LSI pattern, terminal ends of the wirings disposed periodically are always present to cause a step 9 as shown in FIG. 15(e).

However, also in this case, the slope of the step is remarkably moderated by etching back the polycrystalline Si and the metal silicide can be fabricated without causing etching residue.

Further as shown in FIG. 15(e), there is a case of forming a connection with an impurity diffusion layer 10 formed on the surface of the semiconductor substrate. Also in this case, since the inside of the groove is completely buried with the polycrystalline Si, connection between the metal silicide and the impurity diffusion layer can be ensured easily.

One of the features of the present invention is to use the polycrystalline Si formed by introducing impurities upon film formation.

Table 1 shows a result of measuring and comparing the wiring resistivity between the discussed case and the examples of the present invention.

TABLE 1

| Structure | Present invention WSi/polycrystalline Si | Discussed case Polycrystalline Si alone | WSi/poly crystalline Si |
|---|---|---|---|
| Wiring resistivity | 15 ohm/ | 120 ohm/ | 54 ohm/ |
| Sheet resistance in the planar portion | 14 ohm/ | 71 ohm/ | 14 ohm/ |

As apparent from the result above, even in wirings disposed across the steps on the underlying material the present invention can provide an effect of attaining a resistance equal with that in a case free from steps in the underlying material (Table 1: sheet resistance).

Further, the result above shows that the resistance value of the laminate wiring comprising WSi/polycrystalline Si is controlled by WSi.

Accordingly, one of the features of the present invention is to form wirings by laminating a titanium silicide or tungsten of lower resistivity than WSi on a planarized polycrystalline Si.

Embodiment 7

In this embodiment, descriptions will be made to a method of fabricating a d-RAM memory cell by using a wiring forming method as described in Embodiment 6 and further simplifying the fabrication steps by using an organic material with reference to FIGS. 16 and 17.

Figure 16:
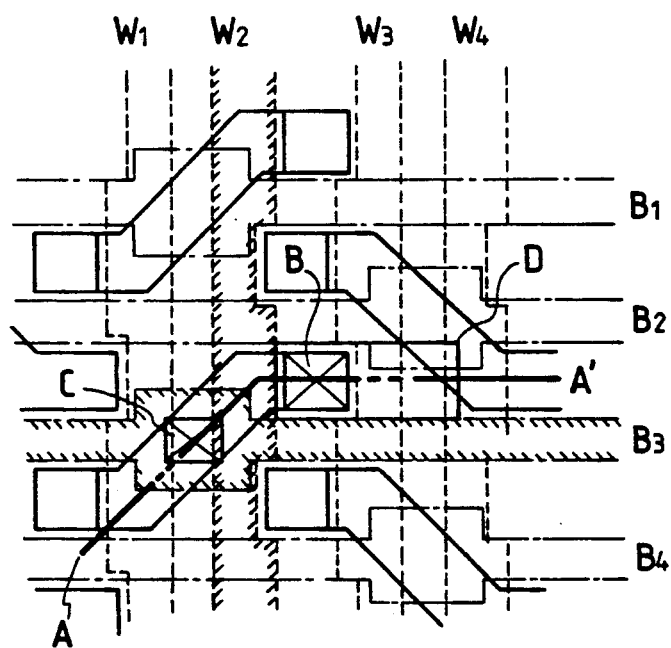
FIG. 16 is a planar layout view of a memory cell for illustrating FIG. 17 showing a seventh embodiment according to the present invention.

At first, FIG. 16 shows an embodiment of a plane layout of a d-RAM memory cell.

Wordlines 1, 2, 3, 4 disposed vertically and data lines 1, 2, 3, 4 disposed laterally intersect with each other.

For better understanding of the drawings, boundaries for the wirings of the wordline 2 and dataline 3 are depicted by hatched lines.

In the figure, the wordline 2 and the data line 3 are to be noted in a sense of selecting one of memory cells.

When the wordline 2 is turned on, charges stored in a capacitor forming region D flow by way of a contact B, a semiconductor substrate just below the wordline, and the data line contact C to the data line 3 to transmit information.

An embodiment of the present invention will be explained with reference to FIG. 17 showing a cross sectional shape at a flexed broken line taken along A—A'.

An SiO$_2$ 202 of 500 nm thickness as an isolation region is formed on a p-type Si single crystal substrate 201 of 10 ohm.cm by using a well-known process.

An SiO$_2$ 203 of 10 nm thickness as a gate oxide film of a MOS transistor is formed by a thermal oxidation process, a polycrystalline Si of 350 nm thickness is deposited by a vapor deposition process and, further, an SiO$_2$ 205 of 250 nm thickness is deposited by a vapor deposition process.

An SiO$_2$ 205 and a polycrystalline Si are fabricated by lithography and dry etching to form a wordline 204.

Figure 17A:
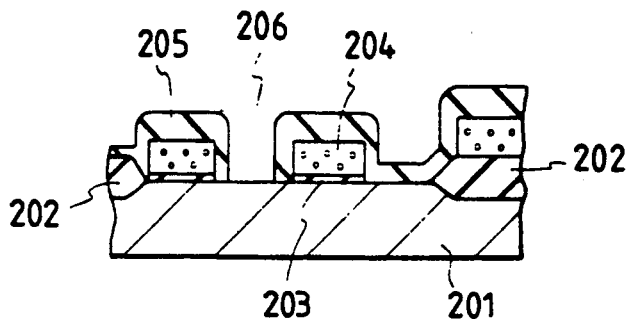
FIGS. 17(a)-17(m) are cross sectional views of successive fabrication of steps showing the seventh embodiment according to the present invention.

Then, after covering the side wall of the wordline 205 with the SiO$_2$ 205, the SiO$_2$ in the data line contact region 206 (corresponding to the region C in FIG. 16) is eliminated by using lithography and dry etching (FIG. 17(a)).

Then, the data lines are formed by the method as described in Embodiment 6.

At first, a polycrystalline Si 207 of 500 nm thickness is deposited by a vapor deposition process.

The polycrystalline Si 207 is deposited while introducing and incorporating a phosphine (PH$_3$) gas into the film in the course of deposition.

In this embodiment, since the gap between the wordlines 204 is set to 300 nm, the groove formed between the wordlines can be filled completely by setting the film thickness of the polycrystalline Si to 500 nm.

Figure 17B:
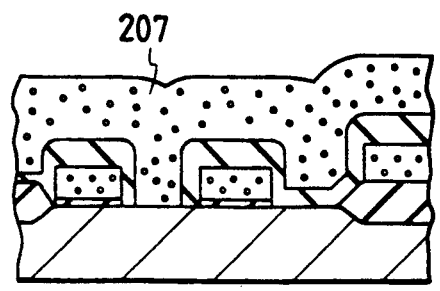

As also described previously with respect to Embodiment 6, one of the features of the present invention is to set the film thickness of the polycrystalline Si such that the recesses present in the underlying material are buried (FIG. 17(b)).

Subsequently, the polycrystalline Si 207 is etched back by a dry etching process using a halogen gas of sulfur hexafluoride (SF$_6$).

It is controlled such that the polycrystalline Si 207 remains by about 100 nm on the wordline.

The surface of the polycrystalline Si is substantially planar even just after the formation. However, if the metal silicide is laminated directly to form the data line, the step is increased due to the fabrication of the data line and the data line itself to bring about a problem, for example, making it difficult for the fabrication in the subsequent wiring steps. It is, accordingly, one of the features of the present invention to reduce the substantial film thickness by etching back the polycrystalline Si and reduce the step in the data line itself.

Figure 17C:
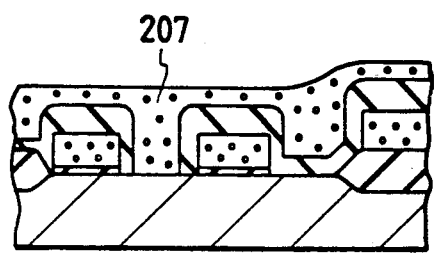

Referring to the range of the etching back, it is desirably to eliminate a portion for 80±10% of the thickness of the thus formed film (FIG. 17(c)).

Figure 17D:
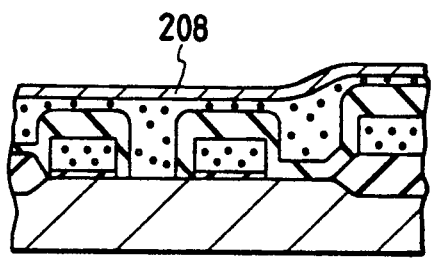

Then, a WSi 208 of 150 nm thickness is deposited by using a sputtering process (FIG. 17(d)).

Further, an SiO$_2$ 209 of 300 nm thickness is deposited by a vapor deposition process.

Figure 17E:
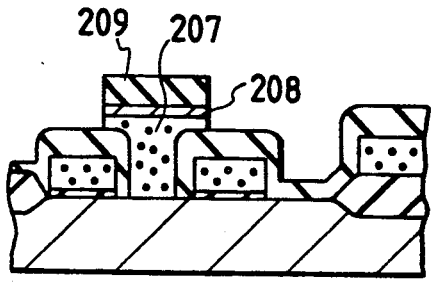

The SiO$_2$ 209, the WSi 208 and the polycrystalline Si 207 are fabricated by lithography and dry etching to form bit wirings (FIG. 17(e)).

Figure 17F:
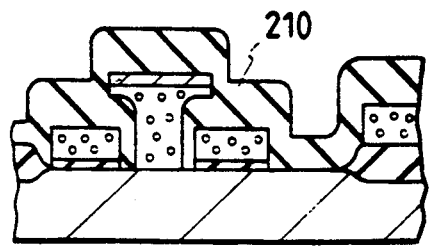
Figure 17G:
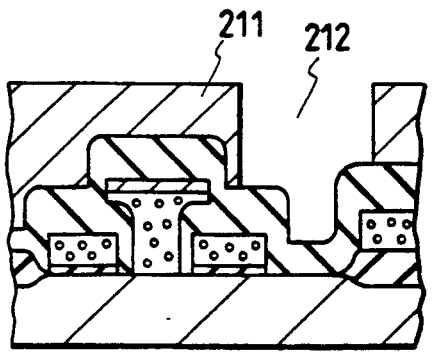

An SiO$_2$ 210 of 100 nm thickness is formed over the entire surface by a vapor deposition process to cover the side walls for the WSi 208 and the polycrystalline Si 207 (FIG. 17(f)).

Then, a capacitor is formed.

A polyimide resin 211 is formed to a thickness of 700 nm in a planar portion by a spin coating method.

As the polyimide resin, type PiX-L110 manufactured by Hitachi Kasei, for example, can be used.

After coating the polyimide resin, a heat treatment is applied in an atmosphere of lower than 1 atm. at 600° C. for 22 min.

Then, a hole 212 is formed in a capacitor forming region by the multi-layer resist method as described previously in Embodiment 3.

The polyimide resin can be fabricated only with active oxygen like that photoresist, etc. (FIG. 17(g)).

Then, only the SiO$_2$ 210 on the Si substrate 201 is selectively removed by using the polyimide resin 211 as a mask, to expose the surface of the Si substrate and form a hole contact 213.

Figure 17H:
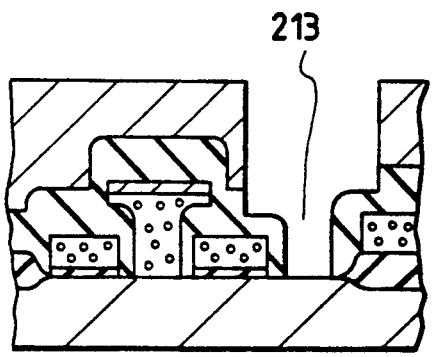

For the selective elimination of the SiO$_2$ 210, dry etching process by a halogen gas is used (FIG. 17(h)).

Since an extremely thin denatured layer may sometimes be formed on the surface of the polyimide upon dry etching of SiO$_2$, it is desirable in such a case to slightly etching the surface by using oxygen.

Then, a polycrystalline Si 214 of 100 nm thickness as a storage electrode for the capacitor is formed by deposition while not removing but leaving the polyimide resin that was used as the mask for the formation of the hole contact 213.

Impurities may be introduced to the polycrystalline 214 by incorporating them at the same time with the film formation like that in the polycrystalline Si 207, or by ion implantation after the formation of the film.

Figure 17I:
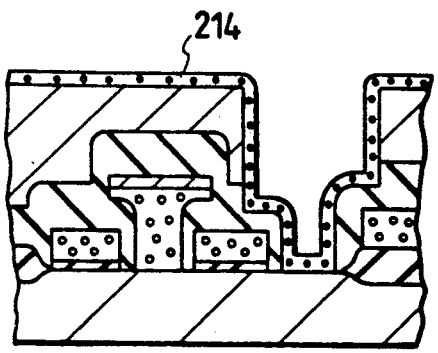

In the case of using ion implantation, however, it is necessary to implant the ions such that they are entered orthogonally, since the polycrystalline Si stands vertically on the side wall of the polyimide resin (FIG. 17(i)).

Figure 17J:
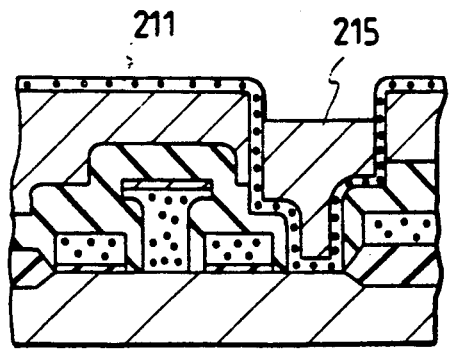

Then, a photoresist is formed over the entire surface to a 1 μm thickness in the planar portion by a spin coating method and etched back to leave the photoresist 215 only in the hole and the surface of the polycrystalline Si 214 on the polyimide resin 211 is exposed (FIG. 17(j)).

Figure 17K:
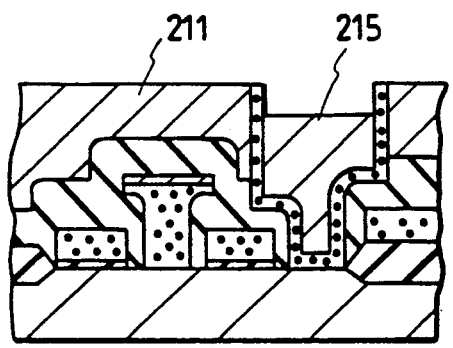

The polycrystalline Si 214 exposed on the polyimide resin 211 is selectively eliminated by a dry etching process (FIG. 17(k)).

Figure 17L:
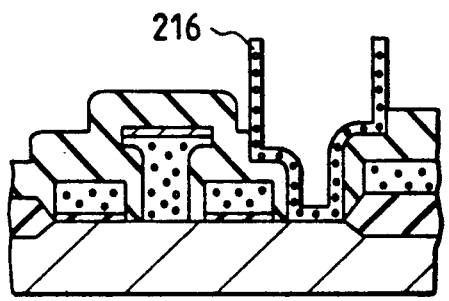

The polyimide resin 211 and the photoresist 215 are eliminated by oxygen plasmas to form shields of the polycrystalline Si as a storage electrode 216 for a capacitor (FIG. 17(l)).

The storage electrode 216, in a plan view observed from the side of the surface, corresponds to the capacitor forming region D in FIG. 16.

Figure 17M:
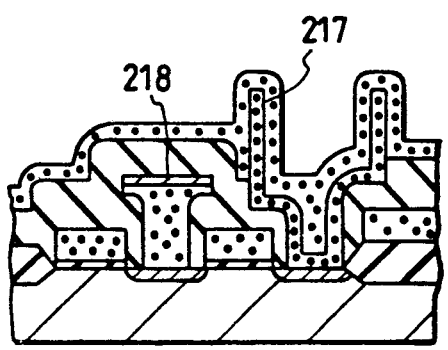

Then, a capacitor insulator film 217 is formed and, further, a capacitor plate electrode 218 is formed to complete the fabrication the steps for the memory cell (FIG. 17(m)).

Subsequently, the wiring formation steps are carried out to conduct connection with peripheral circuits to fabricate an LSI.

In this embodiment, descriptions have been made to the procedures of fabricating the polyimide resin and, thereafter, the underlying SiO$_2$ is fabricated to form a hole contact, shields of the polycrystalline Si with higher accuracy can be formed by forming the hole contact previously then coating the polyimide in a state of exposing the surface of the Si substrate and then applying opening fabrication.

In this embodiment, the hole can be formed extremely easily by using, as a base material for forming shields of the storage electrode, an organic material capable of providing a selectivity ratio almost infinitely greater than that of inorganic materials such as $SiO_2$ or Si.

Accordingly, there is no more requirement for raising the exposed surface of the Si substrate for making a contact with the storage electrode by means of the selective CVD process as in the case shown in FIG. 2 discussed previously.

As a result, it is possible to avoid a problem in a case of using WSi to the dataline that Si nuclei are grown also to the surface of $SiO_2$, which should not be grown upon selective CVD fabrication of the polycrystalline Si due the contamination by the WSi itself, to remarkably lower the selectivity, and there is obtained an effect capable of remarkably improving the production yield.

Further, it can also provide an effect of simplifying the fabrication steps since it no more requires such steps as formation of the polycrystalline Si by the selective CVD process, formation of Si the nitride film and formation of the $SiO_2$. In addition, since the resin can be formed merely by using a convenient spin coater, it can also provide advantageous effect on the improvement of the operation safety and reduction of the cost. Embodiment 8

In this embodiment, descriptions will be made to an application example of the present invention, in combination with the lithographic technic with reference to FIG. 18.

FIG. 18 shows a case of using a multi-layered photoresist method.

As already explained in Embodiments 6 and 7, wirings of polycrystalline Si 302 corresponding to d-RAM wordlines are formed on an Si substrate 301 and the entire surface is covered with an $SiO_2$ 303 formed by a vapor deposition process to form a pseude step on the Si substrate.

The height of the step is adjusted to about 500 nm.

Then, the the multi-layered resist step is applied.

At first, an organic material 304 as the lower resist material of 1.5 μm thickness on the planar portion is formed by a spin coating method.

In this case, it is important to select the film thickness of the organic material 304 such that the surface of the material 304 is made planar.

Then, a SOG (spin coated glass) 305 of 100 nm thickness is formed as an intermediate layer and, further, a photoresist 306 of 600 nm thickness is formed as an upper layer resist by a spin coating method.

Figure 18A:
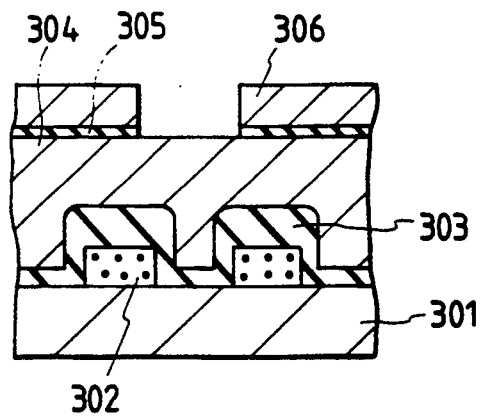
FIGS. 18(a)-18(d) are cross sectional views of successive fabrication steps showing an eighth embodiment according to the present invention.

Then, a pattern is formed to the photoresist 306 by a well-known photoetching method and the SOG 305 is dry etched by using the photoresist 306 as a mask to transfer the pattern (FIG. 18(a)).

Then, the organic material 304 is etched by well-known dry etching using oxygen and, further, pattern transfer is conducted.

Figure 18B:
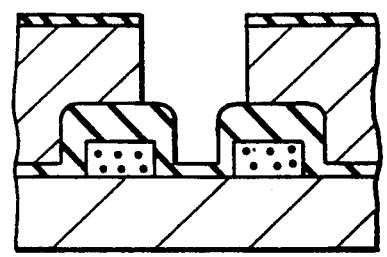

In this case, the photoresist 306 of the upper layer is eliminated simultaneously by etching but the SOG 305 is left not being etched with oxygen and, accordingly, the organic material 304 can be fabricated at a good accuracy by using the SOG 305 as a mask (FIG. 18(b)).

Figure 18C:
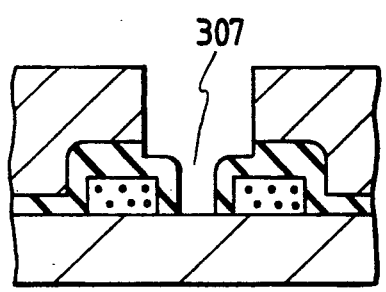
Figure 18D:
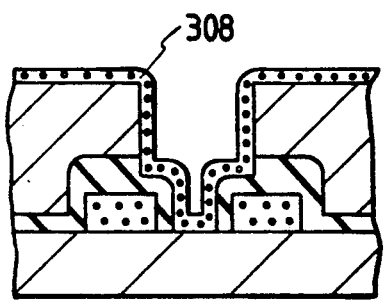

Then, the $SiO_2$ 302 exposed on the underlying material is selectively etched by using the organic material 304 as a mask to expose the surface of the Si substrate and form a contact 307 (FIG. 18(c)).

In the prior art method, it requires complicated steps of once removing the organic material 304 used for the fabrication of the $SiO_2$ 302, forming another inorganic material such as silicon nitride over the entire surface and applying opening or fabrication to the separate inorganic material by using the multi-layered resist method again.

One of the features of the present invention is not to remove the organic material 304 used as the mask for the fabrication of the $SiO_2$ 302 but to leave it as it is and deposit the Si 308 thereover by the vapor deposition process.

Then, a shield of the polycrystalline Si 308 is formed in accordanace with the method as described in Embodiment 7 (FIG. 18 (d)).

In this embodiment, since the $SiO_2$ is selectively eliminated by using the organic material as a mask to expose the surfcace of the Si substrate and, subsequently, the organic material used as the mask is not removed but is used as a supporting base for forming the polycrystalline Si, this can provide an effect capable of ensuring the connection between the polycrystalline Si and the the Si substrate and, at the same time, capable of forming the shield extremely simply and at a good controllability.

The organic material 304 used in this embodiment may be any of other organic materials providing that than the polyimide resin that the material can be etched with oxygen.

Further, although the feature of the present invention have been described regarding the combination with the multi-layered resist method in this embodiment, it is also possible to former a pattern directly on the underlying material and then forming the polycrystalline Si by using a single-resist layered resist method, that is, photoresist or EB resist.

Embodiment 9

In this embodiment, descriptions will be made to an example of burying an polycrystalline only in hole on a predetermimed region Si by using a method of forming the polycrystalline Si on an organic material with reference to FIG. 19.

Figure 19A:
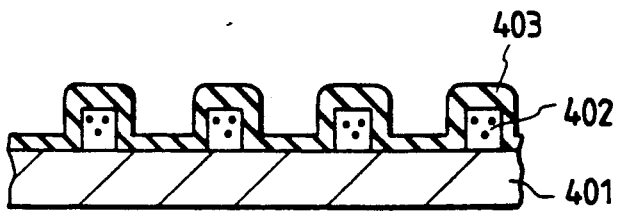
FIGS. 19(a)-19(e) are cross sectional views of successive fabrication steps showing a ninth embodiment according to the present invention.

Wirings of a polycrystalline Si 402 are formed on an Si substrate 401 and the entire surface is covered with an $SiO_2$ 403 to form a pseude steps (FIG. 19(a)).

Figure 19B:
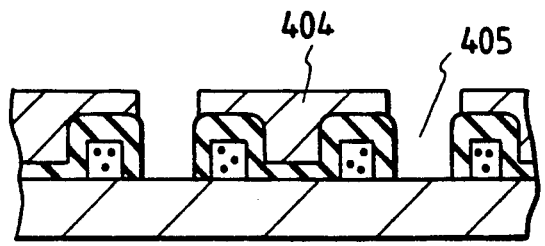

A polyimide resin 404 is formed by a spin coating method and the polyimide resin is selectively eliminated from a predetermined region by the multi-layered resist method as described in Embodiment 3, to form a conctact hole 405 (FIG. 19(b)).

Figure 19C:
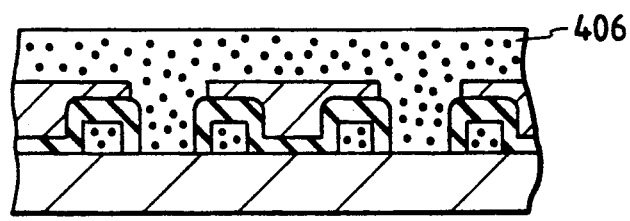

Then, a polycrystalline Si 406 is deposited so as to bury the contact holes 405 by a vapor deposition process (FIG. 19(c)).

Figure 19D:
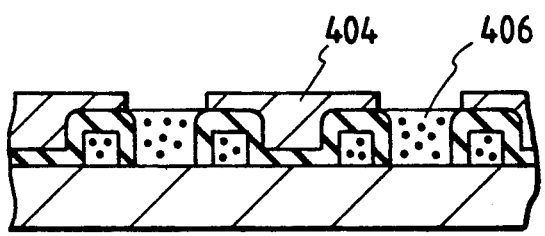

The polycrystalline Si 406 is etched back to leave the polycrystalline Si 406 only at the inside of the contact hole 405 (FIG. 19(d)).

Figure 19E:
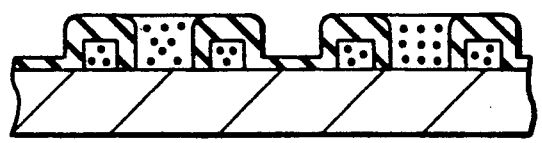

Then, the polyimide resin 404 is removed by oxygen plasmas (FIG. 19(e)).

This embodiment can provide an effect capable of burying the polycrystalline Si by leaving it only in the predetermined region without using the selectively CVD process shown in the discussed case of FIG. 2.

According to the present invention, since the wirings disposed across the steps of the underlaying material can be formed into a substantially planar structure, it can provide an effect capable of reducing the resistance of the wirings themselves.

Further, in a memory LSI in which data lines are disposed across the wordlines disposed periodically since the wiring resistivity of the data lines can be reduced by substantially planarizing the structure of the data lines, it is possible to increase the circuit operation speed and improve the performance of the memory LSI.

In particular, a remarkable effect is obtainable in a so-called shield data type d-RAM in which data lines are disposed directly by way of an insulator film on the wordlines.

Further, since the capacitor constituting the memory cell can be formed by using an organic material, margin for the process can be improved and the process can be simplified remarkably. In addition, since the use of the selective CVD is no more necessary, this enables to avoid a problem that the metal silicide itself constitutes a contamination source and reduce the selectivity, and lowering the production yield and, accordingly, can provide an effect of greatly increasing the production yield.

Further, the material used in the lithographic step can be used as it is for the organic material, steps can be simplified and the a high accuracy for the pattern shape can be attained.

It is further understtod by those in the art that the foregoing description is preferred embodiment of the disclosed device and that various changes and modifications may be made in the invention without departing from the spirit and scope thereof.

What is claimed is:

1. In a dynamic random access memory (DRAM), formed at a main surface of a substrate, including word and data lines and plural memory cells each of which includes a transistor having an active region and storage capacitance, the combination wherein:

each data line has a substantially orthogonally overlapping arrangement with said word lines, with respect to a plan view thereof;

each said active region is disposed, with respect to said plan view, at an angle direction which is substantially different from that of the corresponding ones of said word and data lines;

the data lines are disposed as lower level conductive layers than that for forming charge storage electrodes of said memory cells, said storage capacitance is characterized as including a storage capacitance portion thereof that is provided by a side wall which is directioned substantially perpendicular to that of the main surface of said substrate; and the data lines are higher level conductive layers than said word lines with respect to the main surface of said substrate, said data lines are formed insulatedly above said word lines and over further coductive layers disposed in spacings between respective word lines.

2. A dynamic random access memory according to claim 1, wherein said further conductive layers are formed of polycrystalline silicon material.

3. A dynamic random access memory according to claim 2, wherein said transistor is an MOS transistor, said MOS transistor has a gate formed by a corresponding one of said word lines.

4. A dynamic random access memory according to claim 3, wherein said data lines have substantially planar surfaces and are comprised of a stacked layer arrangement of two different conductive films.

5. A dynamic random access memory according to claim 1, wherein the stacked layer arrangement includes a metal layer or a metal silicide layer laminated on a silicon-containing conductor layer.

* * * * *